US007972752B2

(12) United States Patent
Furukawa

(10) Patent No.: US 7,972,752 B2
(45) Date of Patent: Jul. 5, 2011

(54) PHOTOMASK AND METHOD FOR FORMING A RESIST PATTERN

(75) Inventor: Takamitsu Furukawa, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 302 days.

(21) Appl. No.: 12/134,250

(22) Filed: Jun. 6, 2008

(65) Prior Publication Data

US 2009/0004576 A1     Jan. 1, 2009

(30) Foreign Application Priority Data

Jun. 28, 2007    (JP) ................................ 2007-170887

(51) Int. Cl.
*G03F 1/00*    (2006.01)

(52) U.S. Cl. ............. 430/5; 430/311; 430/394; 365/53; 365/67; 365/55

(58) Field of Classification Search .............. 430/5, 311, 430/394; 355/53, 67, 55
See application file for complete search history.

(56) References Cited

U.S. PATENT DOCUMENTS

| 6,866,969 | B2 | 3/2005 | Miyamae et al. | |
|---|---|---|---|---|
| 2002/0167651 | A1* | 11/2002 | Boonman et al. | 355/67 |
| 2002/0187440 | A1* | 12/2002 | Kochi et al. | 430/394 |
| 2005/0130045 | A1* | 6/2005 | Ozawa | 430/5 |
| 2007/0105023 | A1* | 5/2007 | Zhou et al. | 430/5 |
| 2007/0122718 | A1* | 5/2007 | Mizusako et al. | 430/5 |

FOREIGN PATENT DOCUMENTS

| JP | 08-166666 | 6/1996 |
|---|---|---|
| JP | 2003-177507 | 6/2003 |
| JP | 2007-170887 | 7/2007 |

\* cited by examiner

*Primary Examiner* — Mark F Huff
*Assistant Examiner* — Rashid Alam
(74) *Attorney, Agent, or Firm* — Taft Stettinius & Hollister LLP

(57) ABSTRACT

A resist pattern forming method capable of obtaining a smooth resist pattern. An exemplary method may utilize a photomask including a plurality of mask cells arranged in the form of a matrix. The length of one side of each of the mask cells may be smaller than the length corresponding to the resolution limit of the optical system of the exposure device. Each mask cell may have one or both of a light transmission region and a light shielding region, and the intensity of light passing through each mask cell may be determined by the ratio of the area of the light transmission region to the area of the mask cell. The photomask may be positioned at a vertical focus position other than the optimal focus position. The resist film may be exposed with light and may then be developed to produce the resist pattern.

20 Claims, 12 Drawing Sheets

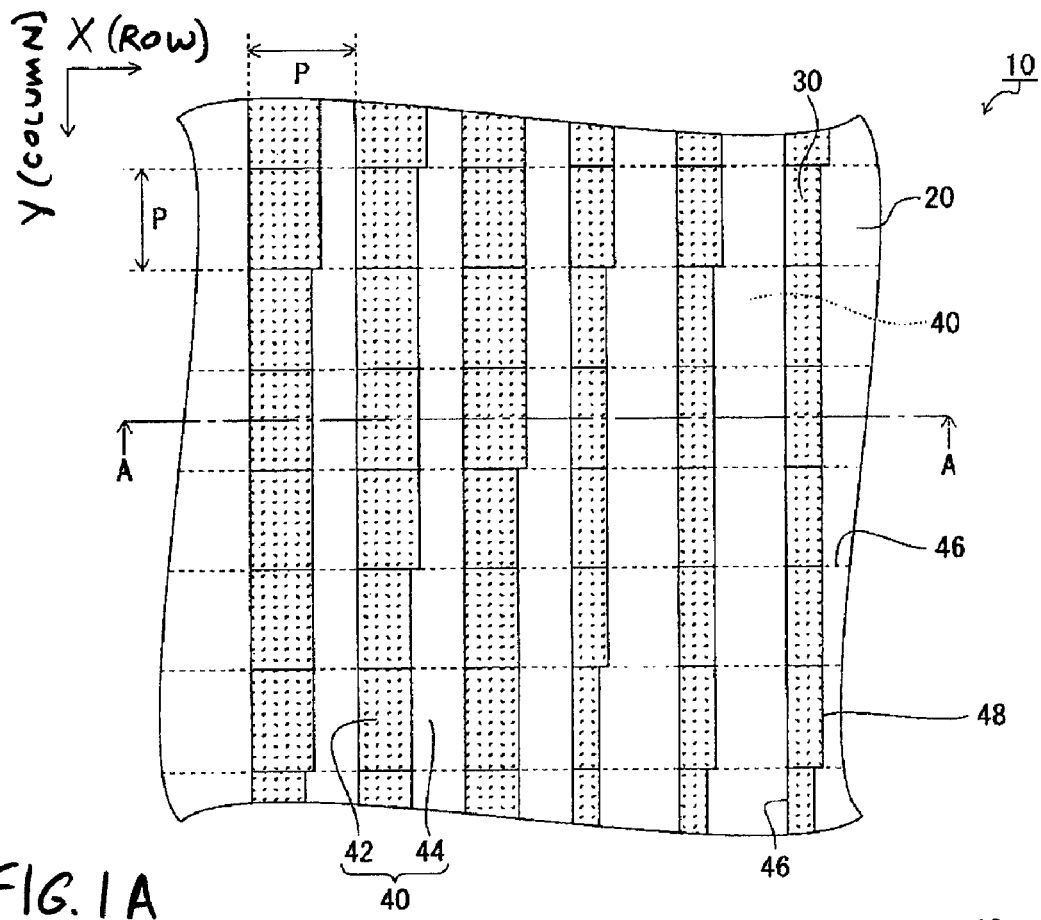
FIG. 1A
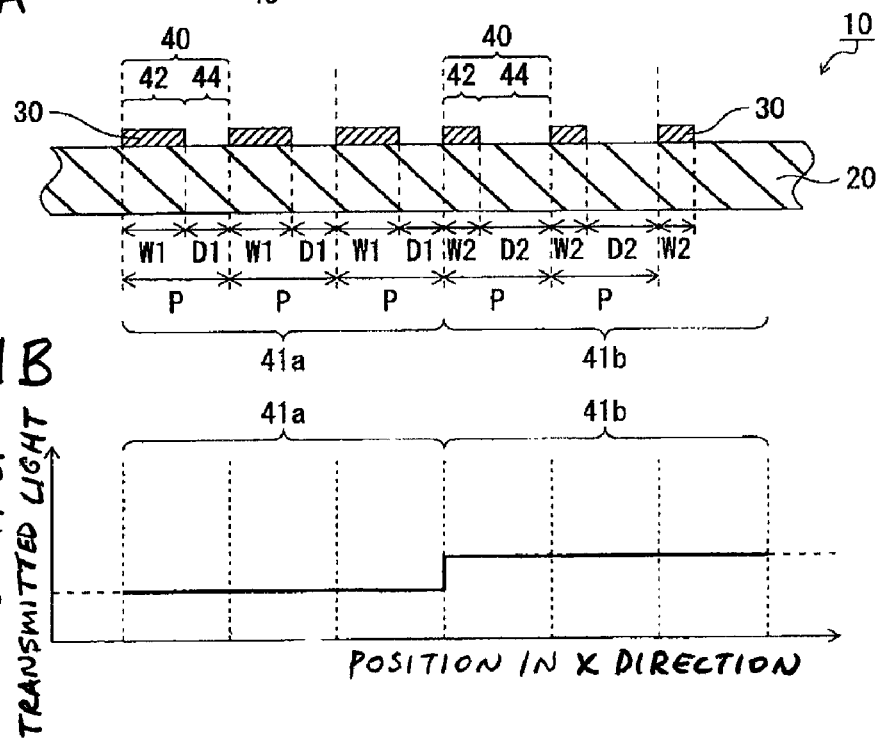
FIG. 1B
FIG. 1C

PHOTOMASK AND METHOD FOR FORMING A RESIST PATTERN

CROSS REFERENCE TO RELATED APPLICATIONS

This application is a claims priority under 35 U.S.C. §119 to Japanese Patent Application Serial No. JP2007-170887 filed on Jun. 28, 2007, entitled "METHOD FOR FORMING RESIST PATTERN, AND PHOTOMASK," the disclosure of which is hereby incorporated by reference in its entirety.

BACKGROUND OF THE INVENTION

1. Field of the Invention

This invention relates to a method for forming a resist pattern and a photomask and, more particularly, to a method for forming a resist pattern used to manufacture a microscopic three-dimensional structure, and a photomask adapted for use in formation of the resist pattern.

2. Description of the Related Art

As is well known in the art, a lithography technique has been used in the micro-machining field for manufacture of semiconductor devices. In a general lithography technique, a planar shape of a photomask pattern is transferred into a resist pattern, and then the resist pattern is transferred onto a target substrate using an etching process to form a pattern similar to the photomask pattern on the target substrate.

In recent years, attempts have been made to etch a substrate in three dimensions using lithography techniques. For example, using an optical transmission system in which an optical signal from a semiconductor laser is propagated by an optical fiber and is received by a light receiving diode, high transmission efficiency has been achieved by focusing oscillating light from the semiconductor laser into a lens and by adjusting the spot diameter of the oscillating light at a fiber incident surface to approximate the core diameter of the optical fiber. An example of a conventional method of manufacturing a fine lens having a diameter of 250 µm or so (hereinafter referred to as a micro lens) used for such high transmission efficiency will be described in brief below (for example, see Japanese Patent Application Publication No. Hei8-166666 and Japanese Patent Application Publication No. 2003-177507).

A manufacturing method disclosed in Japanese Patent Application Publication No. Hei8-166666 has the following steps. First, a resist film is formed by coating a resist material on a target substrate on which micro lenses are to be formed. Next, the resist film is exposed using a photomask provided thereon with a plurality of concentrically formed light shielding films as light shielding regions on a transparent mask substrate, with spaces as light transmitting regions provided between the light shielding regions. Next, the exposed resist film is developed to form resist patterns. The formed resist patterns are thereafter transferred by dry etching onto the target substrate for forming the micro lenses.

In the photomask used therein, the spacing of the light shielding films in a direction along a diameter of a concentric circle is smaller than the resolution threshold of an optical system of an exposure device for which the photomask is used. Accordingly, light passing through the photomask has contrast insufficient to resolve photomask patterns. In addition, the width of the adjacent spaces (the spaces between light shielding films) gradually increases from the center of the concentric circles towards the outer diameter of the concentric circles.

On this account, the light intensity for exposure of the resist film gradually increases moving towards the outer diameter of the concentric circles. When a positive resist exposed using this photomask is developed, a resist pattern having a film thickness decreasing gradually toward the outer side along a diameter is formed.

In addition, Japanese Patent Application Publication No. 2003-177507 discloses a method of forming phase gratings as a photomask by a using plurality of grooves on a mask substrate and gradually changing the intensity of transmitted light with the depth or width of each of the grooves.

The photomask disclosed in Japanese Patent Application Publication No. Hei8-166666 utilizes concentrically arranged light shielding films. A resist film having a uniform thickness at an equal distance from a center (such as a spherical lens) can be easily formed by using photomask patterns having the concentrically arranged light shielding films. Otherwise, the photomask having the concentrically arranged light shielding films can not be used.

In the photomask disclosed in Japanese Patent Application Publication No. 2003-177507, it is difficult to precisely control the depth of each of the grooves constituting the phase gratings. Thus, there arises a problem of deviation in intensity of transmitted light and hence large deviations in resist pattern shape.

In addition, the resolution in a thickness direction of the resist film depends on the maximum and minimum space width in the photomask disclosed in Japanese Patent Application Publication No. Hei8-166666, and depends on the controllability of the depths of the grooves constituting the phase gratings in the photomask disclosed in Japanese Patent Application Publication No. 2003-177507. The resolution in a horizontal direction of the resist film depends on the arrangement interval of the mask patterns in the photomask disclosed in Japanese Patent Application Publication No. Hei8-166666 and the photomask disclosed in Japanese Patent Application Publication No. 2003-177507.

There is a need to decrease the minimum space width of the photomask to increase the positional precision in the horizontal direction or film thickness direction of the resist film, but this may result in significantly increased costs for manufacturing of the photomask. As a result, there is a limit to raising of the positional precision of the resist patterns with the mask patterns alone.

INTRODUCTION TO THE INVENTION

Exemplary embodiments of the invention provide a resist pattern forming method capable of obtaining a smooth resist pattern. An exemplary method may utilize a photomask including a plurality of mask cells arranged in the form of a matrix. The length of one side of each of the mask cells may be smaller than the length corresponding to the resolution limit of the optical system of the exposure device. Each mask cell may have one or both of a light transmission region and a light shielding region, and the intensity of light passing through each mask cell may be determined by the ratio of the area of the light transmission region to the area of the mask cell. The photomask may be positioned at a vertical focus position other than the optimal focus position. The resist film may be exposed with light and may then be developed to produce the resist pattern.

In a first aspect, a method of forming a resist pattern may include the steps of preparing a photomask for forming a resist pattern having a nonuniform film thickness on a main surface of a target substrate, the photomask including a plurality of mask cells arranged in the form of a matrix on a surface of a transparent mask substrate, a length of one side of each of the mask cells being smaller than a length corresponding to a resolution limit of an optical system of an exposure device, and each mask cell including at least one of a light transmission region and a light shielding region, the intensity of light passing through each mask cell depending on a ratio of an area of the light transmission region to an area of the mask cell; setting the optical system of the exposure device at a vertical focus position other than an optimal focus position, the optimal focus position being the vertical focus position at which the exposure device is focused on a resist film formed on the main surface of the target substrate, the vertical focus position lying along a line oriented perpendicular to the main surface of the target substrate; exposing the resist film with light passing through the photomask; and developing the exposed resist film to obtain the resist pattern.

In a detailed embodiment of the first aspect, the method may include the steps of, before the step of setting the optical system, preparing a focus positioning mask having a plurality of band-shaped light shielding films arranged with an interval larger than the length corresponding to the resolution limit of the optical system of the exposure device on the surface of the transparent mask substrate; exposing and developing a plurality of resist films formed on the main surface of the target substrate at a respective plurality of vertical focus positions, and measuring a width of a band-shaped residual resist after each of the plurality of resist films has been developed; and determining the optimal focus position including finding a depth of focus by evaluating a relationship between the plurality of vertical focus positions and the respective measured widths of the band-shaped residual resists. In the step of determining the optimal focus position, the vertical focus position at which the width of the residual resist reaches one of a maximum and a minimum may be determined to be the optimal focus position. In the step of setting the optical system, the optical system may be set at a vertical focus position spaced from the optimal focus position by a distance equal to or greater than the depth of focus. In the step of setting the optical system, the optical system may be set at a vertical focus position spaced from the optimal focus position by a distance between two and ten times the depth of focus. The photomask may be divided into a device forming region and a device non-forming region, a correction region may be provided adjacent to the device forming region within the device non-forming region, and each mask cell in the correction region may have the same ratio of an area of the light transmission region to an area of the mask cell as a mask cell located adjacent to the correction region in the device forming region. A management pattern may be included in the device non-forming region of the photomask, the management pattern may include a plurality of box patterns, each of the box patterns including a plurality of mask cells having an area ratio of an area of the light transmission region to an area of the mask cell, the area ratio is different for different box patterns, and the method may include the step of, after the step of developing the exposed resist film, determining whether or not resist remains for regions corresponding to the box patterns.

In another detailed embodiment of the first aspect, the photomask may be divided into a device forming region and a device non-forming region; a correction region may be provided adjacent to the device forming region within the device non-forming region; and each mask cell in the correction region may have the same ratio of an area of the light transmission region to an area of the mask cell as a mask cell located adjacent to the correction region in the device forming region. At least one of the plurality of mask cells may be square. A management pattern may be included in the device non-forming region of the photomask; the management pattern may include a plurality of box patterns, each of the box patterns including a plurality of mask cells having an area ratio of an area of the light transmission region to an area of the mask cell; the area ratio may be different for different box patterns; and the method may include the step of, after the step of developing the exposed resist film, determining whether resist remains for regions corresponding to the box patterns.

In another detailed embodiment of the first aspect, a management pattern may be included in the device non-forming region of the photomask; the management pattern may include a plurality of box patterns, each of the box patterns including a plurality of mask cells having an area ratio of an area of the light transmission region to an area of the mask cell; the area ratio may be different for different box patterns; and the method may include the step of, after the step of developing the exposed resist film, determining whether resist remains for regions corresponding to the box patterns. The method may include the steps of, before the exposing step, exposing and developing a plurality of resist films formed on the main surface of the target substrate for a respective plurality of different exposure times using a management mask including a pattern having the same configuration as the management pattern; and obtaining exposure sensitivity from a relationship between the different exposure times and the remaining resist for regions corresponding to the box patterns. A correction region may be provided in a region adjacent to the device forming region within the device non-forming region and each mask cell in the correction region may have the same ratio of an area of the light transmission region to an area of the mask cell as a mask cell located adjacent to the correction region in the device forming region. At least one of the plurality of mask cells may be square. The method may include the steps of, before the step of setting the optical system, preparing a focus positioning mask having a plurality of band-shaped light shielding films arranged with an interval larger than the length corresponding to the resolution limit of the optical system of the exposure device on the surface of the transparent mask substrate, exposing and developing a plurality of resist films formed on the main surface of the target substrate at a respective plurality of vertical focus positions, and measuring a width of a band-shaped residual resist after each of the plurality of resist films has been developed; and determining the optimal focus position including finding a depth of focus by evaluating a relationship between the plurality of vertical focus positions and the respective measured widths of the band-shaped residual resists.

In a second aspect, a photomask used to form a resist pattern having nonuniform film thickness on a main surface of a target substrate may include a plurality of mask cells arranged in a matrix on a surface of a transparent mask substrate, a length of one side of each of the mask cells being smaller than a length corresponding to the resolution limit of an optical system of an exposure device using the photomask, each mask cell including at least one of a light transmission region and a light shielding region. The photomask may be divided into a device forming region and a device non-forming region; the photomask may include a correction region in a region adjacent to the device forming region within the device non-forming region; an intensity of light passing through each mask cell is provided may depend on a ratio of an area of the light transmission region to an area of the mask cell; and each mask cell included in the correction region may have the same ratio of an area of light transmission region to an area of mask cell as a mask cell which is adjacent to the correction region and is included in the device forming region.

In a detailed embodiment of the second aspect, at least one of the plurality of mask cells may be square.

In a third aspect, a photomask used to form a resist pattern having nonuniform film thickness on a main surface of a target substrate may include a plurality of mask cells arranged in a matrix on a surface of a transparent mask substrate, a length of one side of each of the mask cells being smaller than a length corresponding to the resolution limit of an optical system of an exposure device using the photomask, each mask cell having one or both of a light transmission region and a light shielding region. The photomask may be divided into a device forming region and a device non-forming region; the photomask includes a management pattern in the device non-forming region, the management pattern including a plurality of box patterns, each of the box patterns including a plurality of mask cells having the same ratio of an area of the light transmission region to an area of the mask cell; an intensity of light passing through each mask cell may depend on the area ratio; and the area ratio may be different for different box patterns.

In a detailed embodiment of the third aspect, a correction region may be provided in a region adjacent to the device forming region within the device non-forming region; and each mask cell in the correction region may have the same ratio of the area of the light transmission region to an area of the mask cell as a mask cell which is adjacent to the correction region and is included in the device forming region. At least one of the mask cells may be square.

BRIEF DESCRIPTION OF THE SEVERAL VIEWS OF THE DRAWINGS

FIG. 1A is a plan view showing a portion of an exemplary photomask;

FIG. 1B is a cross-sectional view of the exemplary photomask of FIG. 1A, taken along line A-A;

FIG. 1C is an exemplary plot of intensity of transmitted light versus position in the X direction;

DETAILED DESCRIPTION OF THE INVENTION

Figure 2:
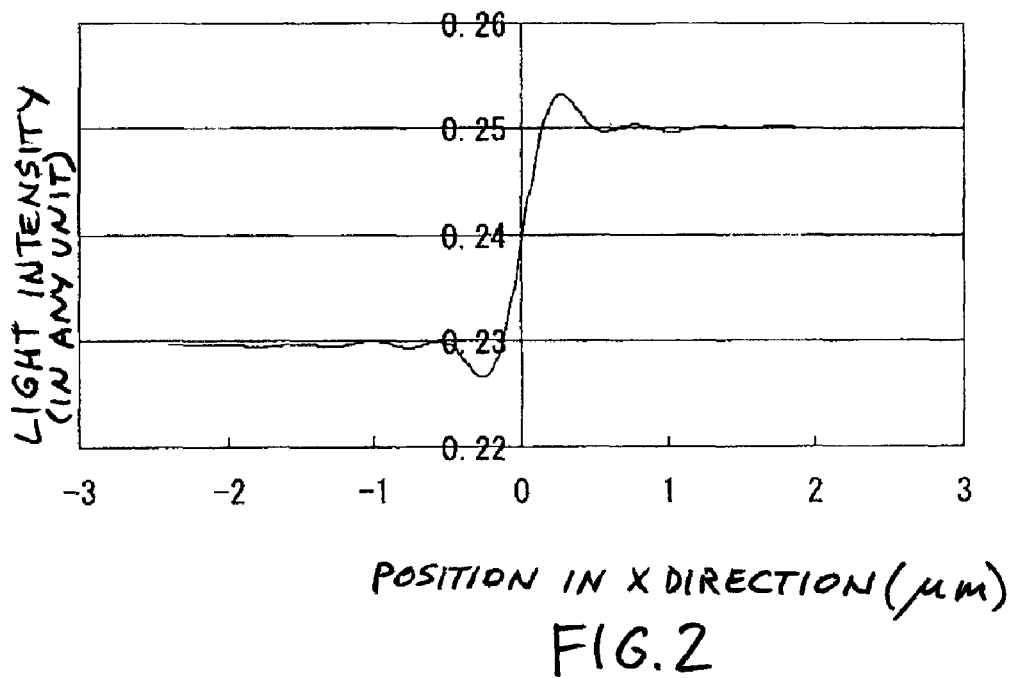
FIG. 2 is a plot showing an exemplary light intensity distribution at an optimal focus position.

Hereinafter, exemplary embodiments of the present invention will be described with reference to the accompanying drawings. In the following description and drawings, the shape, size, and arrangement of components are illustrated to enhance understanding of the present invention. Material and numerical details of components in exemplary configurations of the present invention are merely exemplary. Accordingly, the present invention is not limited to the following embodiments but may be changed and modified in various ways to achieve the effects of the present invention without departing from the spirit and scope of the invention.

Resist patterns of higher resolution than are obtained by typical one-time exposure can be obtained with a photomask alone by exposing a resist film while the vertical focus position of the optical system of the exposure device is at a position other than an optimal focus position by using a photomask having a plurality of square mask cells as minimum units, the length of one side of each square mask cell being less than the resolution limit of the optical system of the exposure device, each mask cell having one or both of a light transmission region and a light shielding region, and an area of the light transmission region determining the intensity of the light passing through each mask cell. It is an object of the invention to provide a resist pattern forming method that is capable of producing a smooth resist pattern without increasing the complexity or cost of manufacturing the photomask.

In order to accomplish the above object, a resist pattern forming method of the present invention may include the following steps. First, in a mask preparing step, a photomask which may be used to form a resist pattern having a nonuniform film thickness on a main surface of a target substrate, is prepared. The photomask may include a plurality of mask cells, which may be square, arranged in the form of a matrix on a surface of a transparent mask substrate, and the length of one side of each of the mask cells may be smaller than the length corresponding to the resolution limit of the optical system of the exposure device using the photomask. In addition, each mask cell may have one or both of a light transmission region and a light shielding region. The intensity of the light passing through each mask cell may depend on the ratio of the area of the light transmission region to the area of the mask cell.

Next, in a vertical positioning step, the vertical focus position may be set at a position other than the optimal focus position. Here, the vertical focus position is a focus position of the optical system of the exposure device, which lies in a direction perpendicular to the main surface of the target substrate. The optimal focus position is the vertical focus position in which the optical system is focused on a resist film formed on the main surface of the target substrate.

Next, in an exposing step, the resist film formed on the main surface of the target substrate may be exposed with light passing through the photomask. In a developing step, the exposed resist film may be developed to obtain a resist pattern.

In the above-described resist pattern forming method, the mask preparing step may include dividing the photomask into a device forming region and a device non-forming region. A correction region may be provided in a region adjacent to the device forming region within the device non-forming region, and each mask cell included in the correction region may have the same ratio of an area of light transmission region to an area of mask cell as a mask cell which is adjacent to the correction region and is included in the device forming region.

In the above-described resist pattern forming method, the mask preparing step may include dividing the photomask into a device forming region and a device non-forming region. A management pattern may be included in the device non-forming region. The management pattern may include a plurality of box patterns, each of the box patterns including a plurality of mask cells having the same ratio of an area of light transmission region to an area of mask cell. The area ratio may be different for different box patterns.

After the developing step, finishing of the resist pattern may be confirmed by checking whether or not a resist remains for resist patterns of regions corresponding to the box patterns.

A photomask of the present invention may be used to form a resist pattern having a nonuniform film thickness on a main surface of a target substrate, and the photomask may include a plurality of square mask cells arranged in the form of a matrix on a surface of a transparent mask substrate.

The length of one side of each of the mask cells may be smaller than a length corresponding to the resolution limit of an optical system for exposing the device using the photomask. Each mask cell may have one or both of a light transmission region and a light shielding region. The intensity of the light passing through each mask cell may vary depending on a ratio of an area of the light transmission region to an area of the mask cell.

The photomask may be divided into a device forming region and a device non-forming region, and a correction region may be provided in a region adjacent to the device forming region and within the device non-forming region. Each mask cell included in the correction region may have the same ratio of an area of the light transmission region to an area of the mask cell as a mask cell which is adjacent to the correction region and is included in the device forming region.

According to an exemplary embodiment of the photomask of the present invention, the photomask may be divided into a device forming region and a device non-forming region, and a management pattern including a plurality of box patterns may be included in the device non-forming region.

Each of the box patterns may include a plurality of mask cells having the same ratio of an area of the light transmission region to an area of the mask cell, and the area ratio may be different for different box patterns.

Because the vertical focus position is set at a position other than the optimal focus position, the variations in resist film thickness at the interface between light transmission regions and mask cell regions are smoother than in a resist pattern obtained by a typical one-time exposure with a photomask alone.

In addition, when the correction region is provided in a region adjacent to the device forming region within the device non-forming region, and when each mask cell included in the correction region has the same ratio of an area of light transmission region to an area of the mask cell as a mask cell which is adjacent to the correction region and is included in the device forming region, deviation of the device forming region from a target value near a boundary between the device forming region and the device non-forming region can be reduced, thereby improving the dimensional precision of the resist patterns.

In addition, by providing the management pattern, it is possible to confirm finishing of resist patterns easily using an optical microscope or the like.

In the accompanying drawings, partial cross-hatching in plan views indicates the emphasis of certain required regions and does not indicate sections.

An exemplary photomask used to form resist patterns having nonuniform film thicknesses on a main surface of a target substrate will be described with reference to FIGS. 1A, 1B and 1C. FIGS. 1A, 1B, and 1C are views depicting a photomask. FIG. 1A is a plan view showing a portion of the photomask. FIG. 1B is a cross-sectional view taken along line A-A in FIG. 1A. FIG. 1C is a plot showing the relationship between a position in a direction along line A-A (X direction) in FIG. 1A and the intensity of transmitted light. In FIG. 1C, the horizontal axis represents the position in the X direction and the vertical axis represents the intensity of the transmitted light.

An exemplary photomask 10 has a plurality of square unit regions having the same size on a surface of a transparent mask substrate 20 such as quartz glass or the like. Hereinafter, the unit regions are referred to as mask cells 40. The mask cells 40 are regions defined on a main surface of the mask substrate 20 by a plurality of virtual grating lines 46 drawn at an equal distance in an X direction (row direction) and a Y direction (column direction) which are perpendicular to each other. Accordingly, the mask cells 40 are arranged in the form of a matrix.

Each of the mask cells 40 has one or both of a light shielding region 42 and a light transmission region 44. A light shielding film 30 is formed on the mask substrate 20 in the light shielding region 42 by, for example, depositing chromium on the mask substrate 20.

Length P of one side of one mask cell 40 (hereinafter, the length P being sometimes referred to as a mask pitch) is smaller than the length corresponding to the resolution limit of the optical system of the exposure device with which the photomask 10 is used. Accordingly, when the photomask 10 is used to expose a resist film formed on the main surface of the target substrate, it is not possible to obtain a contrast sufficient to resolve mask patterns of the photomask.

The larger the area of the light transmission region 44 in the mask cell 40, the greater the intensity of light passing through the mask cell 40. In other words, the intensity of the light passing through the mask cell 40 depends on the ratio of the area of the light transmission region 44 to the area of the mask cell 40. Therefore, the mask cell 40 is a basic unit for controlling the intensity of light passing through the photomask 10. In a first region 41a, in which the width of a light transmission region is D1, and a second region 41b, in which the width of a light transmission region is D2 (>D1), the intensity of the transmitted light in the second region 41b is greater than the intensity of the transmitted light in the first region 41a (see FIG. 1C).

When mask cells having light shielding regions are arranged end-to-end in the column direction, their shielding regions are connected to one another in the column direction. In addition, when adjacent mask cells in the row direction have light transmission regions and light shielding regions, these shielding regions are arranged in an alternating manner with the transmission regions in the row direction.

FIG. 1A shows an example in which each mask cell 40 having both a light transmission region 44 and a light shielding region 42 is bisected by a virtual bisectional line 48 in the Y direction such that the light transmission region 44 is located on one side of the virtual bisectional line 48 (the right side of the virtual bisectional line in the figure) and the light shielding region 42 is located on the other side of the virtual bisectional line 48 (the left side of the virtual bisectional line in the figure). In this manner, it is preferable that, in each mask cell, the light transmission region 44 is located on the same side with respect to the virtual bisectional line 48. This is based on the following reasons.

If a targeted resist shape is a curved shape having successively changing film thicknesses, mask cells 40 having the same light intensity may be consecutively located in regions in which the resist film thickness is smoothly changed. When the light transmission region 44 of each mask cell 40 is located on the same side with respect to the virtual bisectional line 48, the light shielding region in each of the mask cells 40 consecutively arranged in the Y direction and having the same light intensity is configured as a rectangle. The amount of data required to generate the mask patterns depends on the number of rectangles included in the mask patterns. Accordingly, when the light shielding film 30 of each mask cell 40 is collectively formed as one rectangle, the amount of data required for generation of the mask patterns can be reduced. As a result, the time required to manufacture the photomask can be shortened and costs can be reduced.

Although FIGS. 1A and 1B show an exemplary photomask in which each of the mask cells 40 includes a light transmission region 44 and a light shielding region 42, the present invention is not limited to this example. For example, the photomask may include mask cells 40 having only a light transmission region 44 (i.e., with no light shielding region) or mask cells 40 having only a light shielding region 42 (i.e., with no light transmission region).

As one example, a case in which an exposure wavelength λ of an exposure device is 365 nm and an i-line stepper having a reduced projection magnification of 5 is used will be described.

The resolution of an exposure optical system depends on a numerical aperture NA and a coherence factor σ of the projection lens. The following Table 1 shows the dependency of optical contrast M on pitch, numerical aperture NA, and coherence factor σ. It is assumed that the ratio of width D of the light transmission region 44 (space) to width W of the light shielding region 42 (line) is 1:1. The pitch corresponds to the length of the projection of the mask pitch P onto a resist plane. When the reduced projection magnification is 5, the pitch is equal to ⅕ of the mask pitch P.

TABLE 1

| | NA | | | | | | | | |
|---|---|---|---|---|---|---|---|---|---|
| | 0.50 | | | 0.55 | | | 0.60 | | |
| | Pitch(nm) σ | | | | | | | | |
| | 0.3 | 0.5 | 0.7 | 0.3 | 0.5 | 0.7 | 0.3 | 0.5 | 0.7 |
| 400 | 0 | 0 | 0 | 0 | 0 | 0.02 | 0 | 0 | 0.15 |
| 500 | 0 | 0.03 | 0.22 | 0 | 0.25 | 0.40 | 0.20 | 0.46 | 0.55 |
| 600 | 0.19 | 0.46 | 0.55 | 0.57 | 0.67 | 0.69 | 0.87 | 0.84 | 0.81 |

The optical contrast M is expressed by: $M=(I_{max}-I_{min})/(I_{max}+I_{min})$. The intensity of light passing through the photomask varies sinusoidally, and the maximum and minimum of light intensity in one interval are represented by $I_{max}$ and $I_{min}$, respectively.

In general, the resolution of the exposure optical system is proportional to λ/NA. Thus, as the wavelength shortens or the numerical aperture NA increases, the pitch at which the optical contrast M is 0, that is, the pitch at which contrast sufficient to resolve the mask patterns of the photomask can not be obtained, grows smaller. For example, if the numerical aperture NA is 0.5 and the coherence factor σ is 0.5, when the pitch in the resist is smaller than 480 nm (the mask pitch P is smaller than 2.4 μm), the optical contrast M of intensity of transmission light projected on a wafer becomes 0. However, the optical contrast M is not limited to 0 and may lie within a range in which an effect of the optical contrast M on the resist is acceptable even when a small optical contrast M occurs. For example, if the numerical aperture NA is 0.5 and the coherence factor σ is 0.5, when the pitch is 500 nm, the optical contrast M is 0.03. In this case, the effect of the optical contrast M on the resist is acceptable.

As described above, the upper limit of the mask pitch P is determined based on the size at which the optical contrast M becomes 0 by the exposure optical system. The shorter the mask pitch P, the higher the resolution in a horizontal direction. However, there are technical difficulties in decreasing the width D of the light transmission region 44 or the width W of the light shielding region 42 for manufacture of the photomask. Therefore, when the minimum width D of the light transmission region 44 and the minimum width W of the light shielding region 42 are fixed and the length P of one side of the mask cell 40 is decreased, the range of light intensity is reduced.

For example, when the pitch in the resist is 480 nm, it is assumed that the minimum dimension in the resist in a usable mask manufacturing technique is 150 nm. In the following description, a dimension refers to a dimension converted in terms of the resist unless otherwise mentioned. The dimension in the photomask is a multiplication of the dimension of the resist by the reduced projection magnification of 5. At this time, the space width, that is, the width of the light transmission region, which is converted into the dimension in the resist, may be 150 to 330 nm.

As another example, when the pitch is 400 nm, it is assumed that the minimum dimension in the usable mask manufacturing technique is similarly 150 nm. At this time, the space width may be 150 to 250 nm.

The number of gray scales of light when space widths are controlled to have a 1 nm interval therebetween is 181 when the pitch is 480 nm and 101 when the pitch is 400 nm. As the pitch grows smaller, the number of gray scales of light also grows smaller, that is, the resolution of light intensity is lowered. In addition, an aperture area ratio in a cell is 31 to 69% when the pitch is 480 nm and 38 to 63% when the pitch is 400 nm. That is, the smaller the pitch is, the narrower a variable range of light intensity becomes.

Using a high precision mask manufacturing technique, that is, when the minimum dimension in the mask manufacturing technique is reduced, the pitch in the resist can be reduced while maintaining the same number of gray scales. For example, when the pitch is 300 nm and the minimum dimension in the resist is 70 nm, the space width can be set to 70 to 230 nm and the number of gray scales when space widths are controlled to have a 1 nm interval therebetween is 161. However, decreasing the minimum dimension may increase the cost of the mask. Accordingly, there is a need to select an optimal condition for the pitch in the resist in consideration of the target pattern, the exposure optical system, the minimum dimension in the mask manufacturing technique and the mask costs. If the size of the targeted resist is sufficiently large ranging from several tens to several hundreds of μm, the pitch in the resist is suitably 400 to 500 nm.

With the above-described photomask for formation of resist patterns, it is possible to set different intensities of transmission light for different mask cells.

In the following description, an example when an i-line stepper (for example, NSR-i11D available from Nikon Co., Ltd.) is used as the exposure device under exposure conditions of NA=0.5, σ=0.5, and a reduced projection magnification of 5 will be described. A positive resist material (for example, IX410 available from JSR Co., Ltd.) is used as the resist. In this case, since photomask patterns are not resolved when the length of one side of a mask cell is less than 480 nm, the photomask can function as a so-called gray mask that passes light having different intensities for different mask cells. Thus, an example when the pitch is set to be 480 nm will be described.

Although the example using positive resist material is described in the following description, a negative resist material may be used.

FIG. 2 is a plot showing an exemplary light intensity distribution at an optimal focus position. FIG. 2 shows the light intensity distribution on the resist film, which is obtained through a simulation. In FIG. 2, the horizontal axis represents a position (in the unit of μm) in the X direction and the vertical axis represents the light intensity (in any unit). The vertical focus position is set at the optimal focus position. The vertical focus position is a focus position of an optical system of an exposure device and also a position in a direction perpendicular to a main surface of the target substrate. The optimal focus position is a position defined by an optical system of a reduced projection lens of the exposure device and the thickness and refractive index of a resist film. When the vertical focus position coincides with the optimal focus position, it can be said that the optical system is in focus.

In the exemplary light intensity distribution of FIG. 2, space width is 240 nm in a region of X<0 and the space width is 250 nm in a region of X≧0. Although overshoot and undershoot occur near a point of X=0, light intensity of 0.23 nearly remains constant in the region of X<0 having the space width of 240 nm and light intensity of 0.25 nearly remains constant in the region of X≧0 having the space width of 250 nm, and accordingly, the light intensity distribution is varied in a stepped manner.

Figure 3:
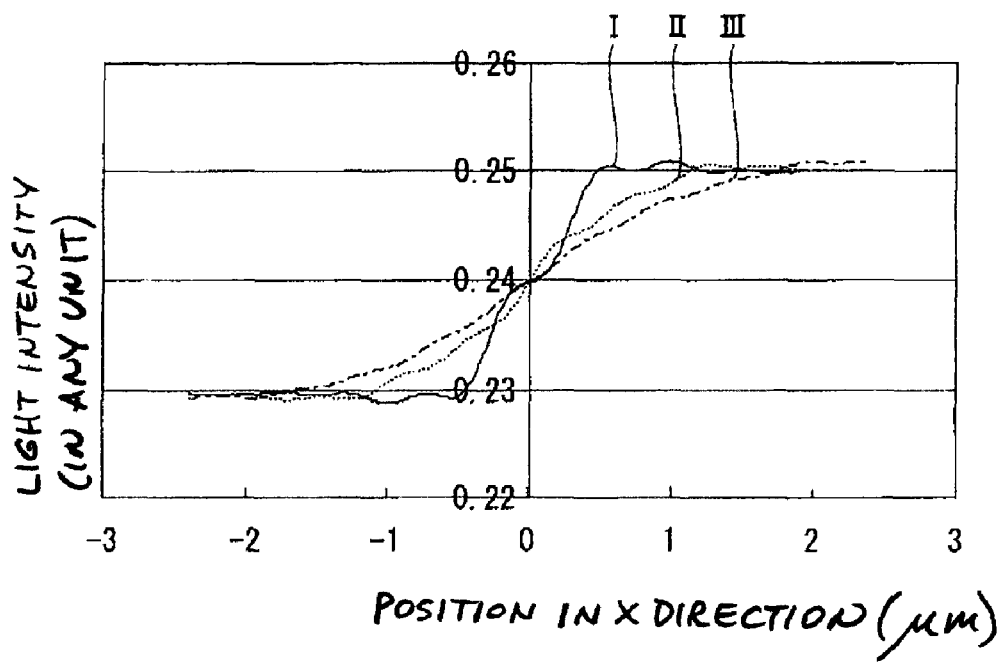
FIG. 3 is a plot showing an exemplary light intensity distribution when the vertical focus position is moved from the optimal focus position.

Next, the vertical focus position is moved from the optimal focus position. FIG. 3 is a plot showing an exemplary light intensity distribution when the vertical focus position is moved from the optimal focus position, showing the results obtained through a simulation like FIG. 2. In FIG. 3, a horizontal axis represents a position (in the unit of μm) in an X direction and a vertical axis represents light intensity (in any unit). In FIG. 3, light intensity distributions when the vertical focus position is deviated by 2, 4 and 6 μm from the optimal focus position are indicated by curves I, II and III, respectively.

When the vertical focus position is moved from the optimal focus position, as the amount of deviation (hereinafter sometimes referred to as defocus amount) increases from 2 μm (curve I) to 6 μm (curve III), the gradient of change of the light intensity with respect to an X coordinate near the point of X=0 grows smaller. In other words, the light intensity distribution falls down from the step shape, and accordingly, the change of the light intensity in a portion in which width of a light transmission region is varied becomes smooth.

An exemplary resist pattern forming method according to a first exemplary embodiment will be described by way of an example of forming a lens by processing a target substrate. The lens is formed as a lens having a radius of 25 μm and a sag of 3.5 μm. The sag represents a height h of a curve from a chord.

Figure 4:
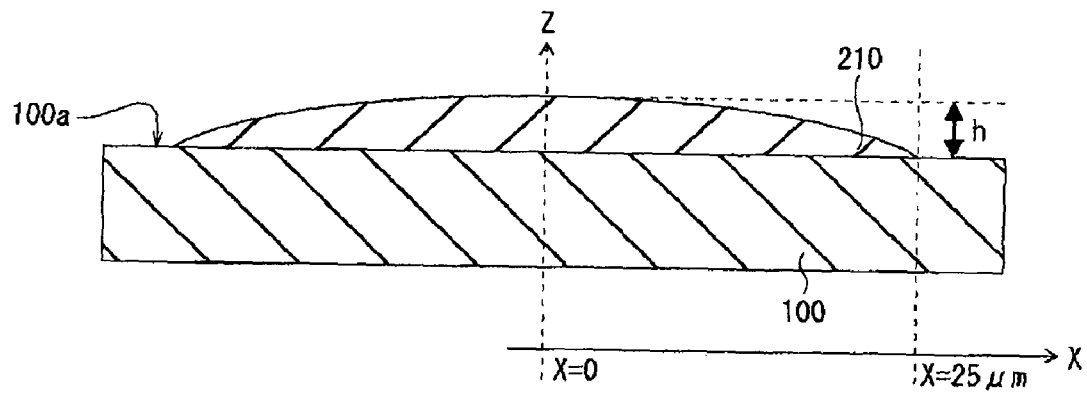
FIG. 4 is a cross-sectional view of an exemplary resist pattern for forming a lens.

FIG. 4 is a cross-sectional view showing a resist pattern for forming a lens by processing a target substrate. A resist pattern 210 is formed on a silicon substrate as a target substrate 100. Here, a direction perpendicular to a main surface 100a of the target substrate 100 is assumed to be a Z direction, and thus, the main surface 100a is assumed to be an X-Y plane. FIG. 4 shows the orientation of the X-Z plane. Here, the center of the lens is assumed to be the origin of an X-Y coordinate system.

When the lens is to be formed by processing the target substrate 100, the resist pattern 210 formed on the target substrate 100 is formed to have the same shape as the lens to be formed. The shape of the resist pattern 210 is transferred onto the target substrate 100 by etching to form the lens.

When the pitch is 480 nm and the space with W is varied with a 10 nm interval from 150 nm to 330 nm, the light intensity and the thickness of the developed resist film can be varied in 19 steps.

Figure 5:
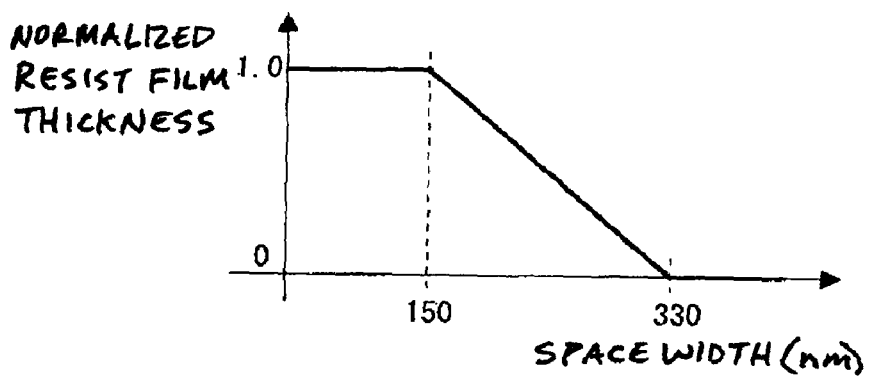
FIG. 5 is an exemplary plot showing the space width dependency of a resist film thickness.

When a resist film is formed by coating the above-described resist material at a film thickness of 3.5 μm on the target substrate and then the resist film is subjected to exposure for 290 ms and development, the thickness of the developed resist film shows a nearly linear characteristic between space widths 330 nm and 150 nm. FIG. 5 is a plot showing the space width dependency of the resist film thickness. In FIG. 5, a horizontal axis represents the space width W (in the unit of nm) and a vertical axis represents a normalized resist film thickness, with film thickness of 3.5 µm normalized as 1.

In a mask preparing step, the photomask described with reference to FIG. 1 is prepared. First, a resist pattern corresponding to a desired shape of a lens is divided into resist cells by a plurality of virtual grating lines drawn at an equal interval (here, 480 nm) in an X direction and a Y direction. The resist cells have a square shape and are arranged in the form of a matrix in the X direction and the Y direction.

Next, in order to expose the resist film with the degree of exposure required to obtain the resist film thickness in the center of each resist cell, the space width of the corresponding mask cell is found using the relationship shown in FIG. 5.

Since space widths can be adjusted in 19 steps, the space widths D of the mask cells corresponding to the resist cells are determined in a manner such that the space width is 330 nm if a targeted normalized resist film thickness is less than 0.053, 320 nm if it lies between 0.053 and 0.105, 310 nm if it lies between 0.105 and 0.158, etc.

Figure 6:
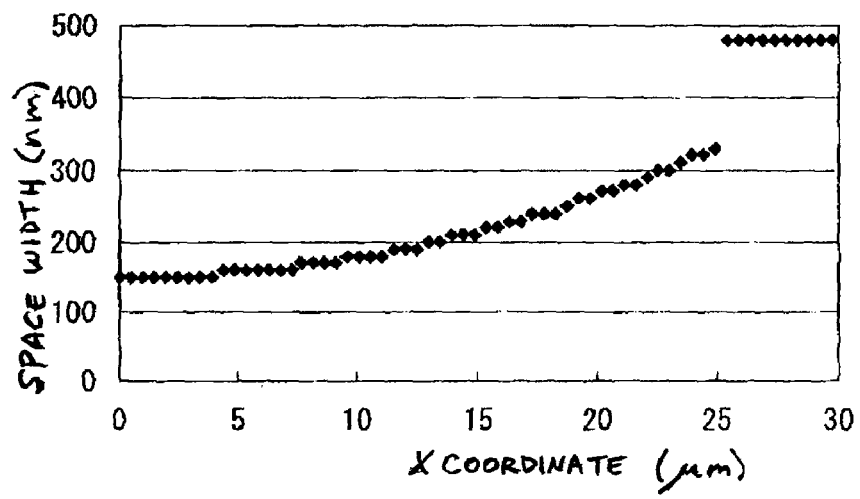
FIG. 6 is an exemplary plot of space width versus X coordinate location.

FIG. 6 is a plot showing the space width distribution of mask cells arranged in the X direction. In FIG. 6, the horizontal axis represents the X coordinate (µm) and the vertical axis represents space width (nm) of the corresponding mask cells. FIG. 6 shows the space width of mask cells for a region of X coordinates of larger than 0.

Subsequent to the mask preparing step, a vertical positioning step is performed. In the vertical positioning step, the vertical focus position is set at a position other than the optimal focus position.

Figure 7A:
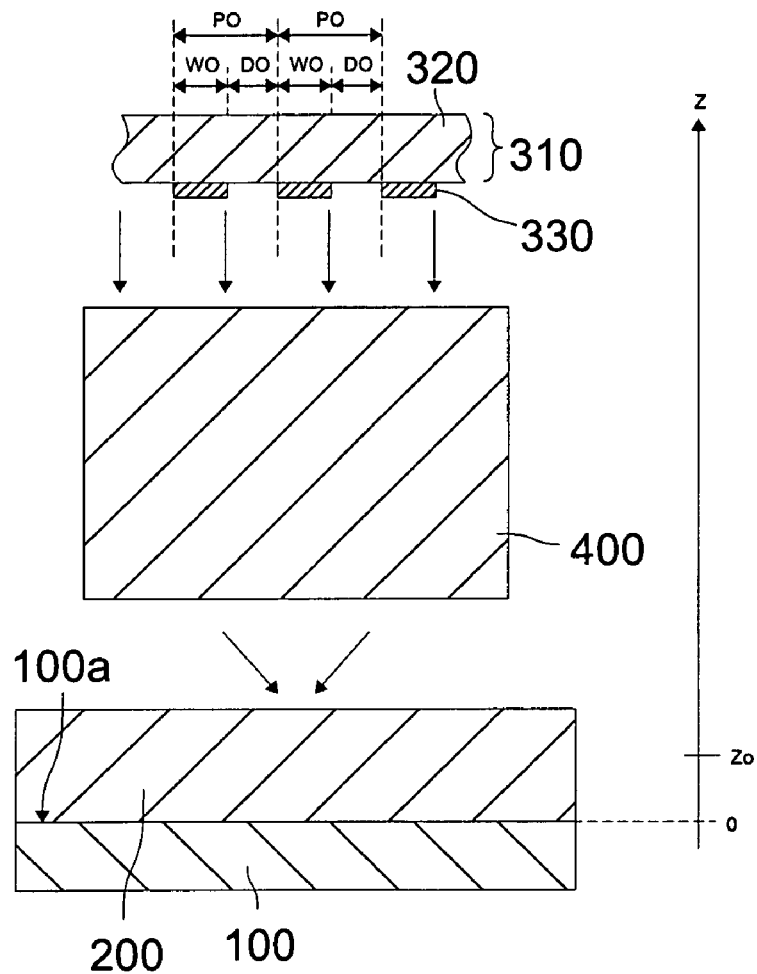
FIG. 7A is a cross-sectional view of an exemplary exposure arrangement.
Figure 7B:
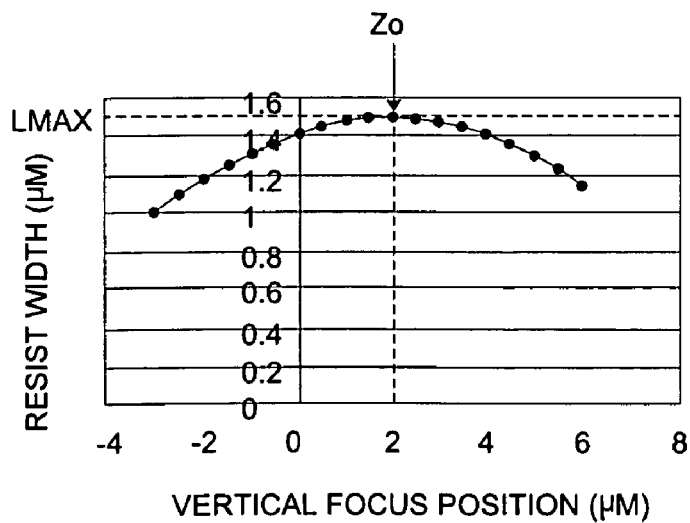
FIG. 7B is an exemplary plot of resist width versus vertical focus position.

A method for finding the optimal focus position will be described with reference to FIGS. 7A and 7B. FIG. 7A is a cross section of an exemplary exposure arrangement and FIG. 7B is a plot of resist width versus vertical focus position.

First, a reference focus position is determined. The reference focus position is a unique position of an exposure device, which is determined by an optical system of the exposure device or the like. This position may be determined by specifications of the exposure device or may be determined using values obtained in a different manufacturing process if the exposure device is used in the different manufacturing process. In this example, the reference focus position is the origin of the Z axis shown in FIG. 7A.

Next, a positioning mask preparing step for preparing a focus positioning mask is performed. A focus positioning mask 310 has a plurality of band-shaped light shielding films 330 arranged (with an interval P0 larger than the length corresponding to the resolution limit of the optical system of the exposure device) on a surface of a transparent mask substrate 320.

Subsequent to the positioning mask preparing step, a resist width measuring step is performed. In this step, using the focus positioning mask 310, exposure and development are performed for the target substrate 100 having the resist film 200 formed on its main surface 100a at a plurality of vertical focus positions, and the width of the band-shaped residual resist present after development is measured. At this time, the material and thickness of the resist film 200 formed on the target substrate 100 have the same conditions as those used for manufacturing the micro lens.

Here, with the configuration of the exposure device used and with a resist film thickness of 3.5 µm, a pattern of 1.0 µm or so can be resolved with the width W and the interval D of the light shielding region. However, an aspect ratio of 2 to 2.5 is suitable in order to prevent a so-called pattern failing down effect in which a band-shaped pattern (hereinafter sometimes referred to as a line pattern) of a developed resist falls down. Therefore, here, the width W0 and the interval D0 of the light shielding region are set to be 1.5 µm.

The width of the line pattern of the remnant of the resist obtained by the development is measured by, for example, a critical dimension-scanning electron microscope (CD-SEM).

Next, an optimal focus position acquiring step is performed. In this step, from a relationship between the vertical focus position and the width of the remnant of the resist, a depth of focus is found in consideration of the optimal focus position and variation in the exposure step.

FIG. 7B is a plot showing a relationship between the vertical focus position (focus position in a Z direction) and the resist width. Here, the main surface 100a of the target substrate 100 is set to be a reference focus position, i.e., the coordinate origin of the Z axis, and a direction toward a reduce projection lens 400 is set to be a positive direction of the Z axis.

The vertical focus position at which the width of the line pattern is maximized becomes the optimal focus position Z0. Here, when Z=+2.0 µm, the resist width reaches its maximum ($L_{max}$) and the resist width corresponding to the width W of 1.5 µm of the light shielding region is obtained. In addition, when a negative resist is used as the resist material, the resist width reaches its minimum when the vertical focus position is set on the optimal focus position Z0.

In addition, a focus position at which the resist width lies within a range of ±5% from the maximum ($L_{max}$) is an allowable range of focus position (depth of focus). In this case, a range of ±2 µm from the optimal focus position Z0, that is, 0 µm<Z<+4 µm, becomes the depth of focus. In addition, the depth of focus may be determined based on the required precision and may be set narrower or wider than ±5%.

Here, due to lens aberrations in the optical system, unevenness of the target substrate and the resist, and variations in the precision of the vertical position of the exposure device in the exposure process, the focus position may deviate from the set position depending on the horizontal position of the target substrate. Although the lens aberration, the unevenness of the target substrate and the resist, and the set precision of vertical position of the exposure device lie within a range of ±0.1 to ±0.5 µm, their combination results in deviation by 1 µm of the focus position from the optimal focus position. Therefore, even when the focus position is set within the depth of focus, the focus position may be deviated from the depth of focus depending on the position of the target substrate.

Thus, the focus position is typically set within a range of depth of focus considering variation of the depth of focus (hereinafter referred to as corrected depth of focus) in the exposure process.

For example, when the depth of focus is ±2 µm and the variation of depth of focus in the exposure process is ±1 µm, the corrected depth of focus becomes ±1(=2−1) µm. Within the corrected depth of focus, even when there is variation in the exposure process, all of the exposure regions fall within the depth of focus.

Although it is described herein that the depth of focus is obtained by actual measurement while changing the vertical position and the corrected depth of focus is obtained in consideration of variation in the exposure process which is obtained separately, the present invention is not limited to this example. For example, the exposure may be performed for the vertical focus position while changing the horizontal position and the corrected depth of focus may be obtained by actual measurement from a result of measurement of the resist width over the entire surface of the target substrate.

Next, using the above-described photomask, exposure and development are performed under a condition where the vertical focus position is set on a position other than the optimal focus position. Here, the vertical focus position is set on a position spaced preferably by at least the corrected depth of focus, more preferably by two to ten times the corrected depth of focus, from the optimal focus position. In addition, a value appropriate for the defocus amount (the amount of distance between the vertical focus position and the optimal focus position) may be selected through simulation or actual measurement. Hereinafter, a method for selecting the defocus amount will be described.

FIGS. 8A, 8B, 8C, and 8D are plots showing resist film thickness as the vertical focus position is varied. In these figures, the horizontal axis represents the position (in the unit of μm) on the X axis and the vertical axis represents the resist film thickness (in the unit of μm). The thickness of the developed resist film is indicated by curve I and the thickness of the resist film corresponding to a desired shape of the lens is indicated by curve II.

FIGS. 9A, 9B, 9C, and 9D are plots showing the difference between the target resist film thickness and the developed resist film thickness as the vertical focus position is varied. In these figures, the horizontal axis represents the position (in the unit of μm) on the X axis and the vertical axis represents the difference (in the unit of μm) between the target resist film thickness and the developed resist film thickness. Notably, FIGS. 8A to 8D and 9A to 9D show the same region as FIG. 6.

Figure 8A:
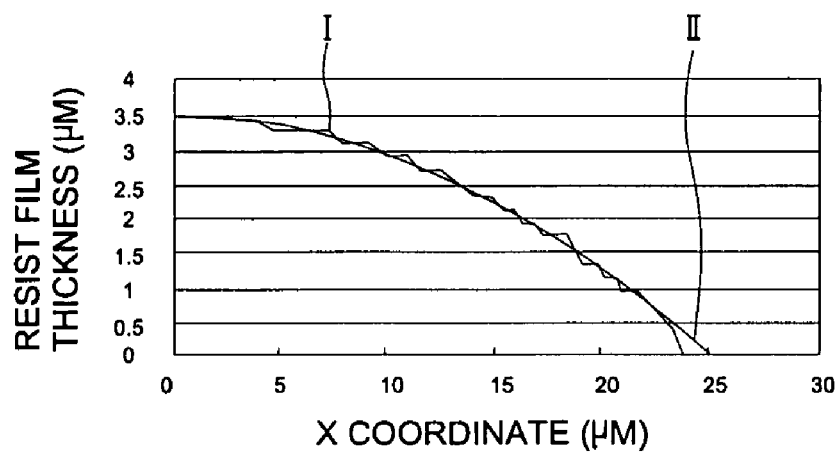
FIG. 8A is an exemplary plot of resist film thickness versus X coordinate location.
Figure 9A:
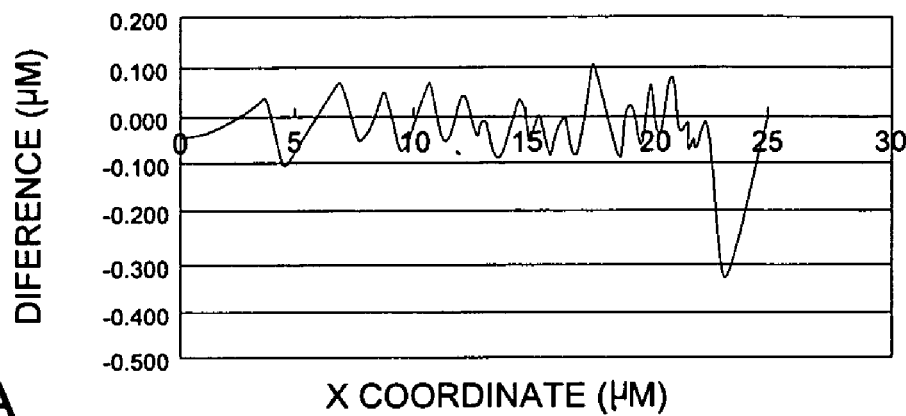
FIG. 9A is an exemplary plot of the difference between a target resist film thickness and a developed resist film thickness versus X coordinate location.

FIGS. 8A and 9A show the distribution when the vertical focus position is at 2 μm, which is the optimal focus position. In this case, in a portion in which the width of the light transmission region is changed, a stepped change of the light intensity reflecting the width of light transmission region is apparent, although overshoot or undershoot appears in the light intensity distribution.

Figure 8B:
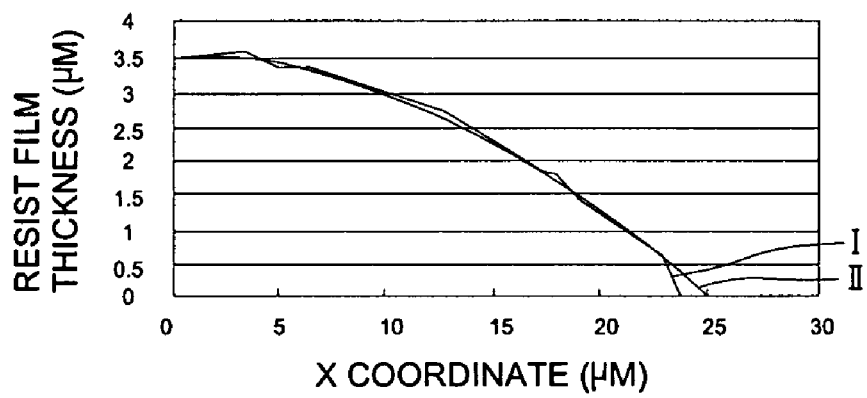
FIG. 8B is an exemplary plot of resist film thickness versus X coordinate location.
Figure 8C:
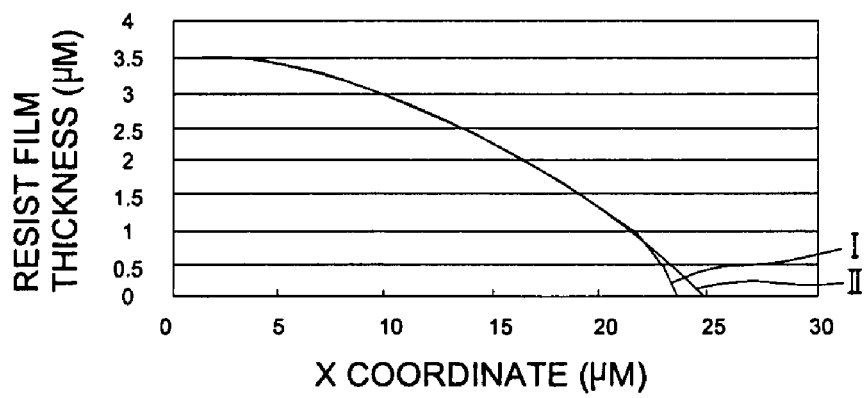
FIG. 8C is an exemplary plot of resist film thickness versus X coordinate location.
Figure 8D:
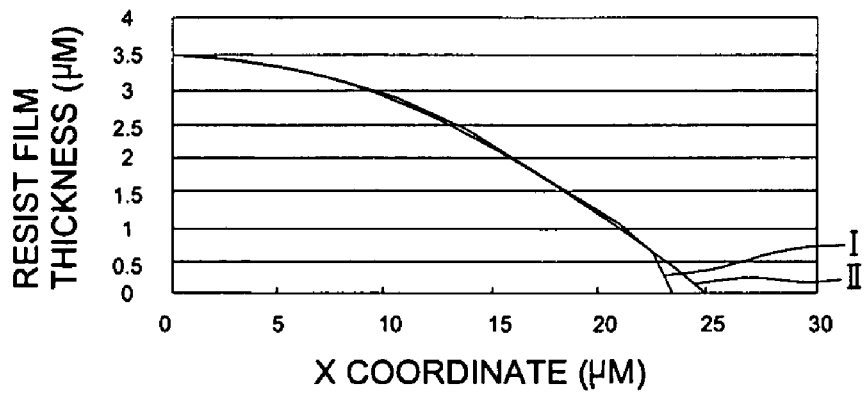
FIG. 8D is an exemplary plot of resist film thickness versus X coordinate location.
Figure 9B:
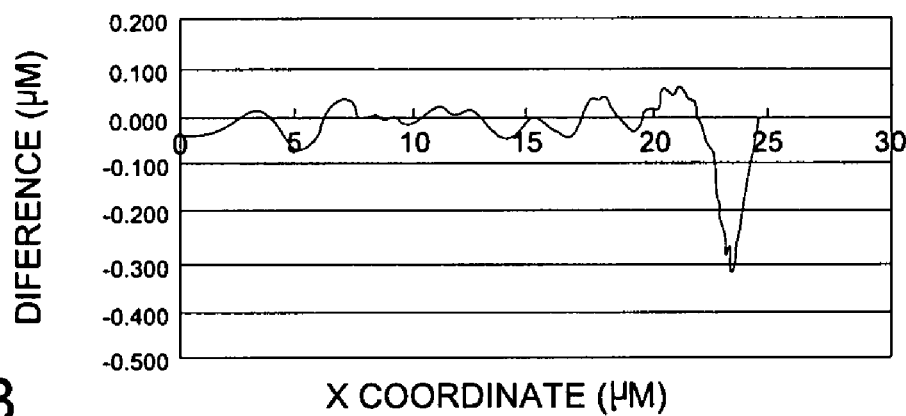
FIG. 9B is an exemplary plot of the difference between a target resist film thickness and a developed resist film thickness versus X coordinate location.
Figure 9C:
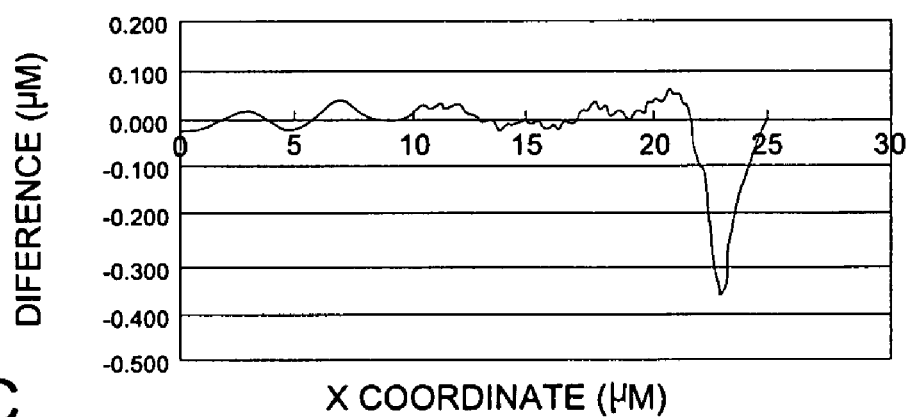
FIG. 9C is an exemplary plot of the difference between a target resist film thickness and a developed resist film thickness versus X coordinate location.
Figure 9D:
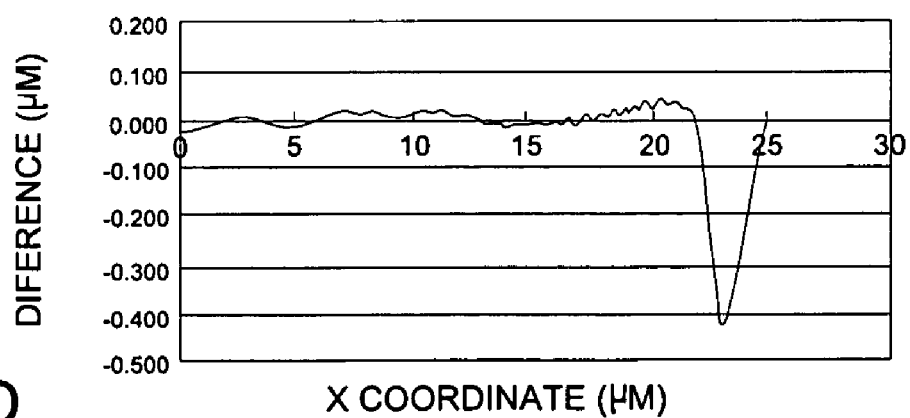
FIG. 9D is an exemplary plot of the difference between a target resist film thickness and a developed resist film thickness versus X coordinate location.

FIGS. 8B and 9B show the difference between the light intensity distribution and the target value when the vertical focus position (i.e., the Z coordinate) is 0 μm. FIGS. 8C and 9C show a difference between the light intensity distribution and the target value when the vertical focus position is −2 μm. FIGS. 8D and 9D show a difference between the light intensity distribution and the target value when the vertical focus position is −4 μm.

As the vertical focus position moves farther away from the optimal focus position, that is, the defocus amount increases, the change of the light intensity becomes smooth in the vicinity of the variation of the width of the light transmission region. Accordingly, the difference from the target value becomes small in the region in which the X coordinate is less than 20 μm. On the other hand, in the region where the X coordinate is more than 20 μm, that is, in an end portion of the lens, as the defocus amount increases, the difference from the target light intensity increases.

Figure 10A:
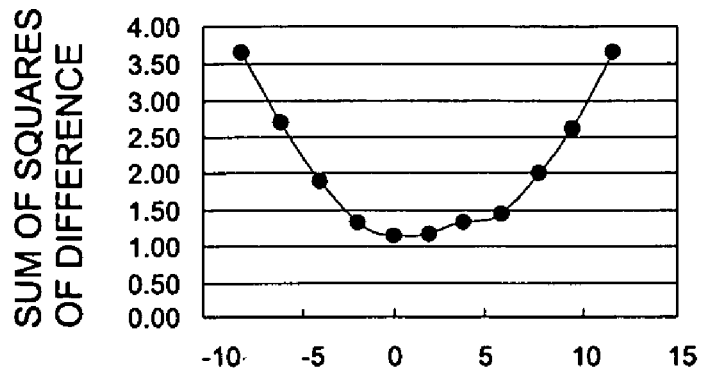
FIG. 10A is an exemplary plot of the sum of the squares of the difference between target resist film thickness and developed resist film thickness versus vertical focus position.
Figure 10B:
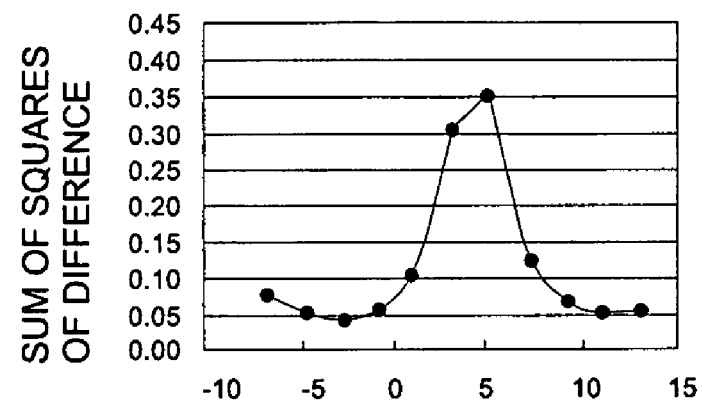
FIG. 10B is an exemplary plot of the sum of the squares of the difference between target resist film thickness and developed resist film thickness versus vertical focus position.
Figure 10C:
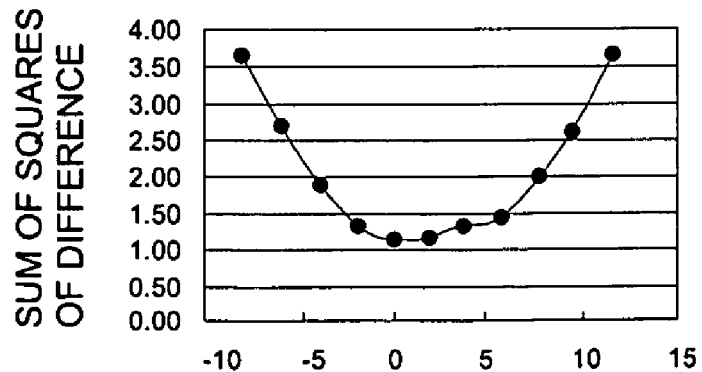
FIG. 10C is an exemplary plot of the sum of the squares of the difference between target resist film thickness and developed resist film thickness versus vertical focus position.

FIGS. 10A to 10C show a relationship between the vertical focus position and the sum of squares of the difference between the target resist film thickness and the developed resist film thickness. In FIGS. 10A, 10B, and 10C, the horizontal axis represents the vertical focus position and the vertical axis represents the sum of the squares of the difference between a target resist film thickness and a developed resist film thickness. FIG. 10A shows an X range of 0 to 25 μm, that is, the entire portion from the center to the edges of the lens. FIG. 10B shows an X range of 0 to 20 μm, that is, a portion near the center of the lens (hereinafter sometimes referred to as a lens upper portion) except an end portion of the lens (hereinafter sometimes referred to as a lens lower portion). FIG. 10C shows an X range of 20 to 25 μm, that is, the lens lower portion.

As shown in FIG. 10B, for the lens upper portion (the X range of 0 to 20 μm), the difference reaches its maximum when the vertical focus position lies within a range of +2 to 4 μm, that is, near the optimal focus position Z0, and reaches minimums when the vertical focus position lies near −4 μm and +10 μm.

In addition, as shown in FIG. 10C, for the lens lower portion (the X range of 20 to 25 μm), the difference reaches its minimum when the vertical focus position lies near Z=+2 μm, which is the optimal focus position Z0.

In this manner, the focus positions at which the difference becomes minimal are different from each other in the lens upper and lower portions, however, as a whole, as shown in FIG. 10A, the sum of the squares of the difference becomes smallest near 0 μm, that is, with the vertical focus position distanced by 2 μm, which is two times the corrected depth of focus of 1 μm, from the optimal focus position Z0 (Z=+2 μm) in a negative direction. In this case, 2 μm is selected as the defocus amount when the sum of the squares of the difference reaches a minimum, and the vertical focus position may be set at 0 μm (=Z0−2 μm). At this time, the sum of the squares is approximately 1.04 and is smaller by 10% than the sum of the squares of 1.14 when the vertical focus position is set at the optimal focus position Z0.

In addition, with the main surface of the target substrate set at the reference focus position as the origin of the Z axis, in order to change the vertical focus position with respect to the origin, a relative position relationship between the main surface of the target substrate and the vertical focus position may be established. In other words, the vertical focus position may be set by moving the target substrate along the Z axis, with the focus position of the exposure device fixed, or the vertical focus position may be set by moving the focus position by adjusting the optical system of the exposure device, with a position of the target substrate along the Z axis remaining fixed.

In the above-described exemplary resist pattern forming method according to the present invention, since the exposure is performed at a position other than the optimal focus position which is optimal for resolving the photomask pattern, the light intensity corresponding to each mask cell becomes smoother as compared to gray scales of light obtained by typical one-time exposure using the photomask alone. As a result, it is possible to obtain a smoother resist pattern closer to a desired shape as compared with an exposure is performed at the optimal focus position which is optimal for resolving the photomask pattern.

As described above regarding the first embodiment, the sum of the squares of the difference from the target value is minimized when Z=0 μm.

However, the lens upper portion (see FIG. 10B) with a large radius of curvature is different than the lens lower portion (see FIG. 10C) with a small radius of curvature.

In the lens upper portion (0<X<20), when the vertical focus position is deviated by six to eight times the corrected depth of focus ±(1 μm) from the optimal focus position Z0 (=+2 μm) (Z=−4, +10 μm), the sum of the squares of the difference from the target value is minimized.

On the other hand, in the lens lower portion (20<X<25), the sum of the squares of the difference from the target value is minimized when the vertical focus position is set at the optimal focus position Z0 (=+2 μm), and, as the vertical focus position is moved from the optimal focus position Z0, the sum of the squares of the difference from the target value increases.

This indicates that an effect of retrogression of the lens end portion increases when the vertical focus position is deviated from the optimal focus position Z0.

Thus, in a second exemplary embodiment, for example, the focus position is set at the position (Z=−4 μm) at which the sum of the squares of the difference from the target value is minimized for the lens upper portion and a correction pattern is provided for the lens lower portion.

The second exemplary embodiment has the same general configuration as the first embodiment, except that a photomask having a correction pattern provided in a lens non-forming region is used. The correction pattern is provided around the lens forming region.

Figure 11:
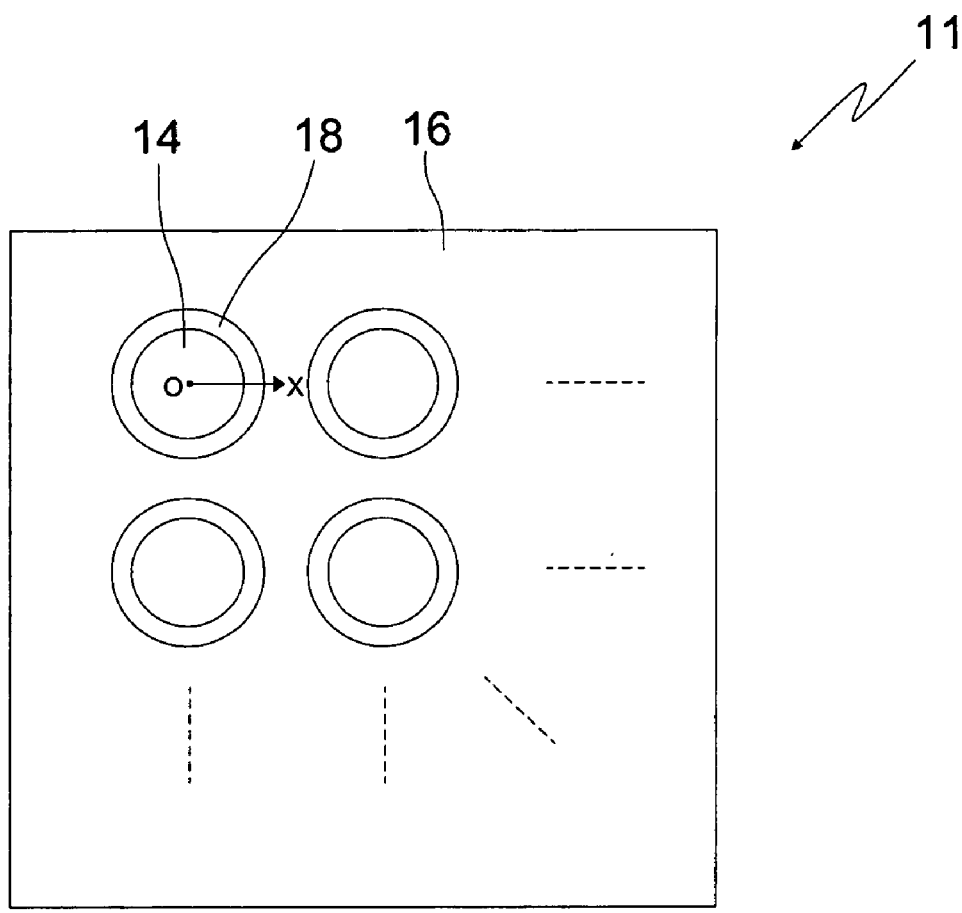
FIG. 11 is a plan view of a second exemplary embodiment of a photomask.

FIG. 11 is a plan view for showing a photomask according to the second exemplary embodiment. A photomask 11 is divided into a lens forming region 14 as a device forming region and a lens non-forming region 16 as a device non-forming region other than the lens forming region 14. A correction region 18 is provided in a region adjacent to the lens forming region 14 within the lens non-forming region 16.

A mask cell included in the correction region 18 (hereinafter sometimes referred to as a correction pattern) has the same ratio of the area of the light transmission region to the area of the mask cell as a mask cell included in an adjacent lens forming region.

For example, if a mask cell of the lens non-forming region is a pattern having no light shielding region, as a vertical focus position is deviated from an optimal focus position, a portion near the circumference of the lens forming region is exposed by light passing through the mask cell of the lens non-forming region and having an intensity stronger than the set light intensity. On this account, the difference from the set light intensity increases. Thus, when the correction pattern is provided near the lens forming region, the difference from the set light intensity decreases even near the circumference of the lens forming region, approximating to an ideal shape.

In addition, any number of correction patterns may be used depending on the defocus amount or the like. If the defocus amount is small, the width of the correction pattern may be narrow. On the other hand, if the defocus amount is large, the width of the correction pattern may be widened since the portion of the lens non-forming region affecting the lens forming region is widened.

Figure 12:
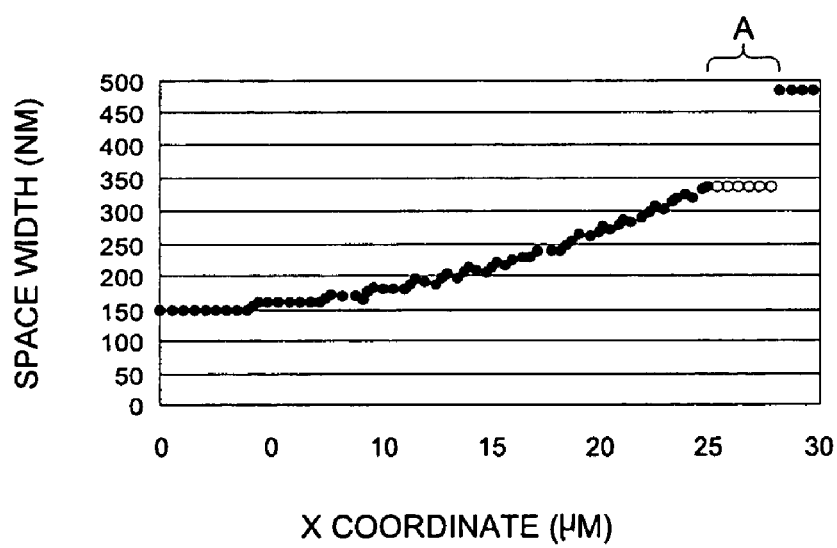
FIG. 12 is an exemplary plot of space width versus X coordinate location for the second exemplary embodiment photomask.

FIG. 12 is a plot showing an exemplary space width distribution of mask cells arranged in an X direction. In FIG. 12, the horizontal axis represents the X coordinate (μm) and the vertical axis represents the space width (nm) of the corresponding mask cell. The space width of the mask cell is shown for the region in which the X coordinate is more than 0 on the X axis with the lens center as the origin in the X-Y plane. A correction pattern is provided in an outer side (portion indicated by A in FIG. 12) of the lens forming region.

An exemplary light intensity distribution when the number of correction patterns is varied will be described with reference to FIGS. 13A to 13C and 14A to 14C.

Figure 13A:
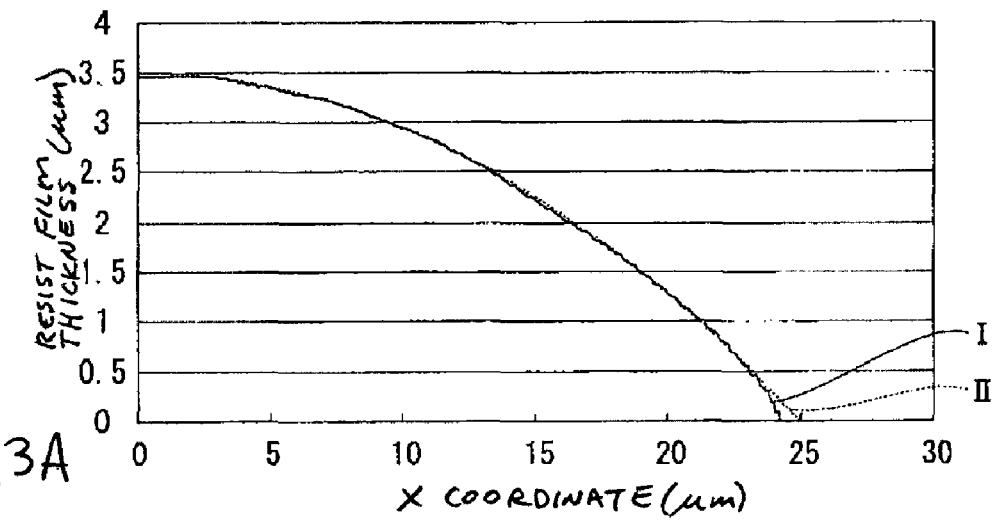
FIG. 13A is an exemplary plot of resist film thickness versus X coordinate location.
Figure 13B:
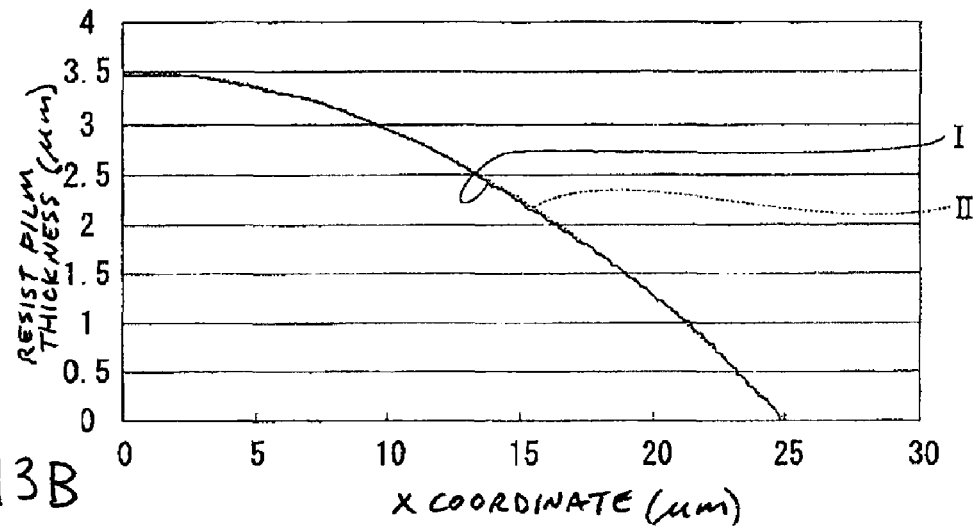
FIG. 13B is an exemplary plot of resist film thickness versus X coordinate location.
Figure 13C:
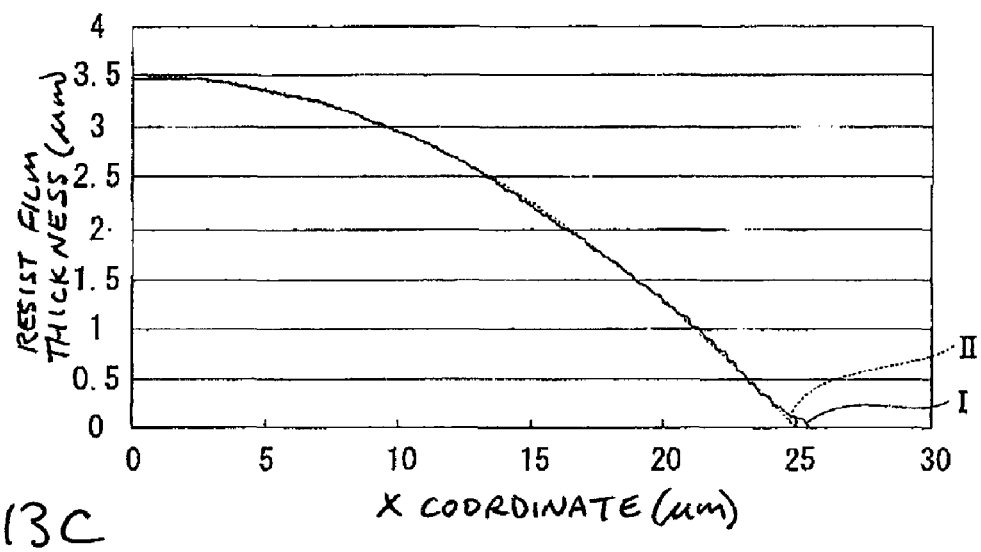
FIG. 13C is an exemplary plot of resist film thickness versus X coordinate location.

FIGS. 13A, 13B, and 13C are plots showing the resist film thickness when the number of correction patterns is varied. In these figures, the horizontal axis represents the position (in the unit of μm) on the X axis and the vertical axis represents the resist film thickness (in the unit of μm). The thickness of the developed resist film is indicated by curve I and the thickness of the resist film corresponding to the desired shape of the lens is indicated by curve II.

Figure 14A:
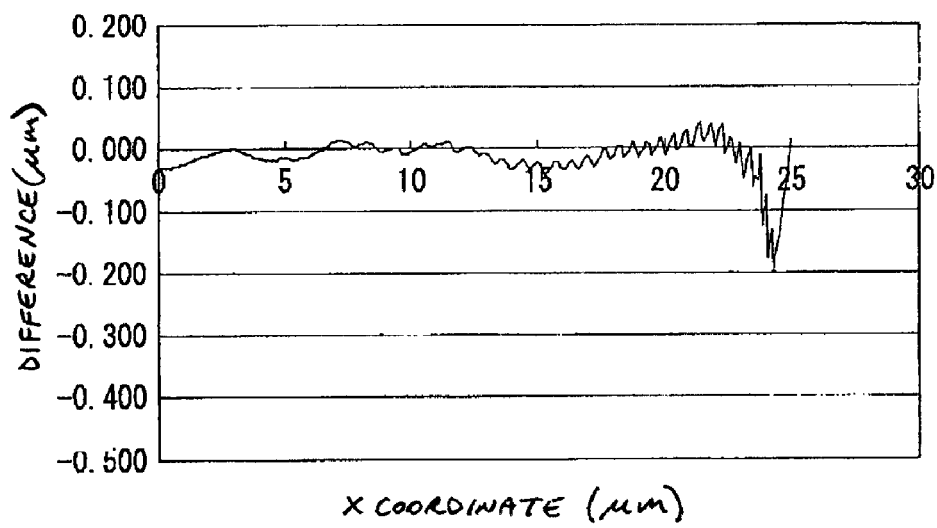
FIG. 14A is an exemplary plot of the difference between target resist film thickness and developed resist film thickness versus X coordinate location.
Figure 14B:
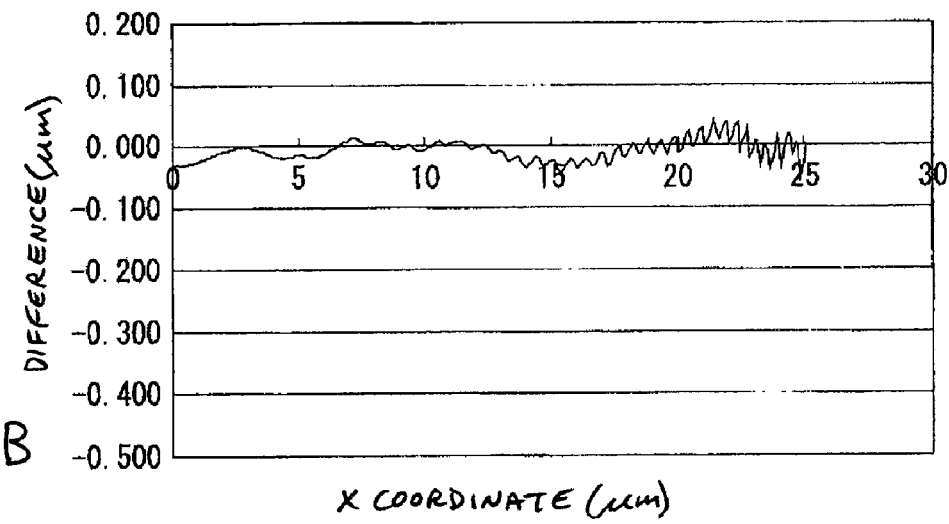
FIG. 14B is an exemplary plot of the difference between target resist film thickness and developed resist film thickness versus X coordinate location.
Figure 14C:
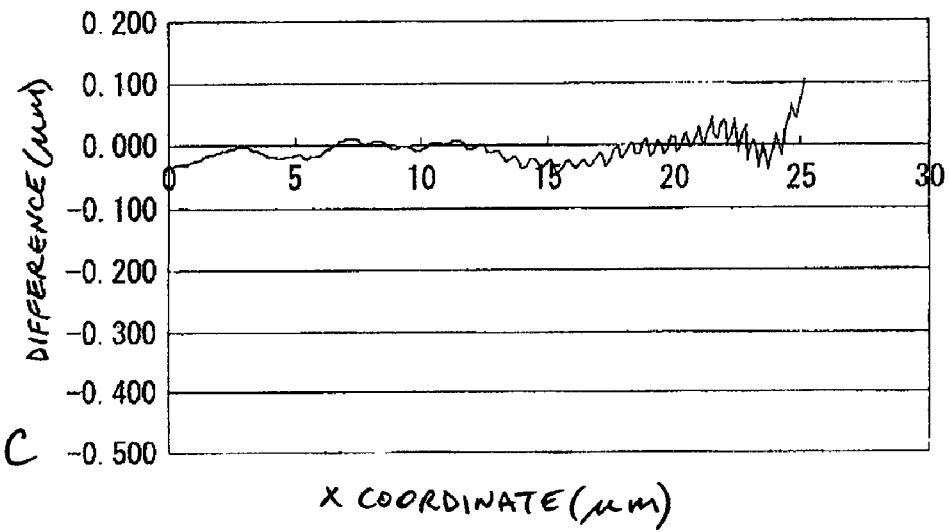
FIG. 14C is an exemplary plot of the difference between target resist film thickness and developed resist film thickness versus X coordinate location.

FIGS. 14A, 14B, and 14C are plots showing the difference between the target resist film thickness and the developed resist film thickness when the number of correction patterns is varied. In these figures, the horizontal axis represents the position (in the unit of μm) on the X axis and the vertical axis represents the difference (in the unit of μm) between the target resist film thickness and the developed resist film thickness.

FIGS. 13A to 13C and 14A to 14C show a distribution when a vertical focus position is −4 μm, that is, when the vertical focus position is at the position where the sum of the squares of the difference from the target value reaches a minimum for the lens upper portion.

In FIGS. 13A and 14A, the number of correction patterns is 4. In FIGS. 13B and 14B, the number of correction patterns is 6. In FIGS. 13C and 14C, the number of correction patterns is 8.

As shown in FIG. 14A, when the vertical focus position is −4 μm and the number of correction patterns is 4, the difference from the target shape decreases to 0.2 μm as compared to a maximum difference of 0.3 μm for the configuration of the first exemplary embodiment having no correction pattern.

When the number of correction patterns is increased to 6, the difference from the target shape further decreases to a maximum of 0.05 μm (FIG. 14B).

When the number of correction patterns is further increased to 8, the difference from the target shape increases to 0.1 μm as compared when the number of correction patterns is 6 (FIG. 14C). It is believed that this is based on the following reasons, for example.

There are some cases where light other than light passing through a corresponding mask cell irradiates a peripheral region of the resist layer due to scattered light. In these cases, the contribution of the scattered light is also considered in the design of the mask patterns. Since the scattered light is reduced as the number of correction patterns increases, the lens lower portion is not expected to be exposed to scattered light.

Accordingly, when the number of correction patterns is set to 8, the resist film becomes thicker than the target thickness in the lens lower portion.

In addition, since a substrate check after exposure and development is performed to verify the presence of a resist, it is preferable that a resist remains in the lens forming region 14 and that all resists is removed from the lens non-forming region 16. Thus, the width of the correction pattern is preferably as small as possible.

Figure 15:
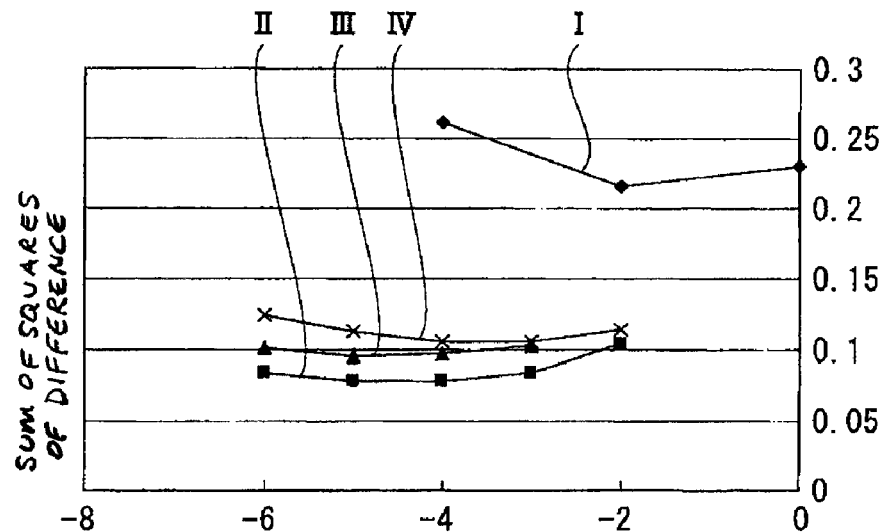
FIG. 15 is an exemplary plot of the sum of the squares of the difference between target resist film thickness and developed resist film thickness versus vertical focus position.

FIG. 15 shows the relationship between the vertical focus position and the sum of the squares of the difference between the target resist film thickness and the developed resist film thickness. FIG. 15 shows the sum of the squares of the difference between the target resist film thickness and the developed resist film thickness when the vertical focus position is varied and when the number of correction patterns is 4, 6, 7, and 8. In FIG. 15, the horizontal axis represents the vertical focus position and the vertical axis represents the sum of the squares of the difference between the target resist film thickness and the developed resist film thickness. In FIG. 15, cases where the number of correction patterns is 4, 6, 7, and 8 are indicated by curves I, II, III and IV, respectively.

When the vertical focus position is −4 μm and the number of correction patterns indicated by curve II in the figure is 6, the sum of the squares of the difference becomes less than 0.1, that is, decreases to 1/10 of the minimum of 1.04 in the first exemplary embodiment.

In this manner, with the configuration having the correction pattern around the device forming region of the photomask, deviation of the device forming region from a target value near a boundary between the device forming region and the device non-forming region can be reduced, thereby raising the dimensional precision of the resist patterns.

In a typical semiconductor manufacturing process, it is common that a line and space pattern having alternating light shielding regions and light transmission regions is provided as a management pattern and a finish condition is managed based on dimensions of the pattern. In order to improve precision, the dimension is preferably the same dimension as the finest pattern used in the process.

However, since the pitch of the patterns used in the above embodiment of the present invention is less than the resolution limit of the optical system of the exposure device, a line and space pattern formed with the pitch is not resolved at all. Accordingly, the line end space pattern can not be used as a management pattern for management by dimension. Thus, a photomask having a plurality of BOX patterns as management patterns is used.

Figure 16:
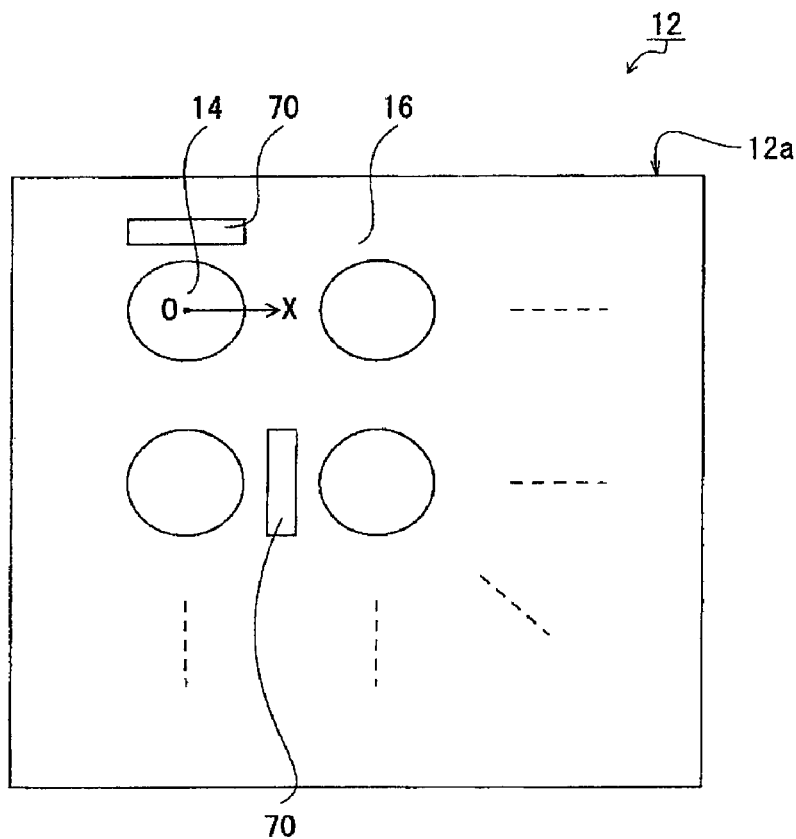
FIG. 16 is a plan view of a third exemplary embodiment of a photomask.

FIG. 16 is a schematic diagram of an exemplary photomask according to a third exemplary embodiment of the present invention. A mask cell of a photomask 12 is divided into a lens forming region 14 as a device forming region and a lens non-forming region 16 as a device non-forming region. A management pattern 70 is formed in the lens non-forming region 16. A plurality of management patterns may be provided near the perimeter 12a of an exposure region, between lens forming regions 14, etc. as desired.

Figure 17:
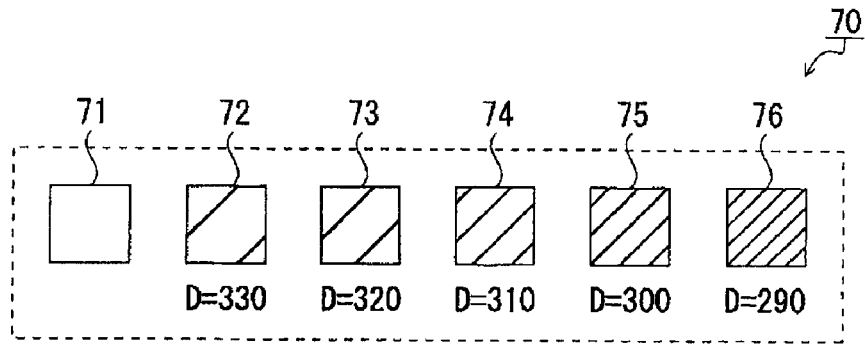
FIG. 17 is a schematic diagram of an exemplary management pattern.

FIG. 17 is a schematic diagram of an exemplary management pattern. One management pattern 70 has a plurality of BOX patterns 71, 72, 73, 74, 75, 76. Each BOX pattern 71, 72, 73, 74, 75, 76 is formed as a pattern of a size which can be confirmed using an optical microscope, and has a square shape whose one side is, for example, 10 to 100 μm. Within the BOX patterns 71, 72, 73, 74, 75, 76 are arranged line and space patterns having the same pitch as the photomask, i.e., the gray mask, described with reference to FIG. 1. A space width is constant in each BOX pattern and is different for different BOX patterns.

The space width may be selected with five kinds in size-increasing order. In addition, the management pattern may have a BOX pattern including no light shielding region as a reference.

When the length of one side of a mask cell, that is the pitch, is 480 nm, a typical minimum dimension is 150 nm and a typical minimum interval width is 10 nm, the management pattern may have five kinds of BOX patterns 72, 73, 74, 75, 76 having space widths of 330, 320, 310, 300 and 290 nm and a BOX pattern 71 as a reference for all light transmission regions.

Using a management mask including a pattern having the same configuration as the management pattern 70, a sensitivity measuring step for obtaining exposure sensitivity may be performed. In the sensitivity measuring step, exposure and development are performed for a resist film formed on a main surface of a target substrate for different exposure times. Thereafter, for resist patterns of regions corresponding to the BOX patterns, it is determined whether or not resist film remains for each of the exposure times and the exposure sensitivity is obtained from a relationship between the exposure times and the remaining exposed resist film.

Figure 18A:
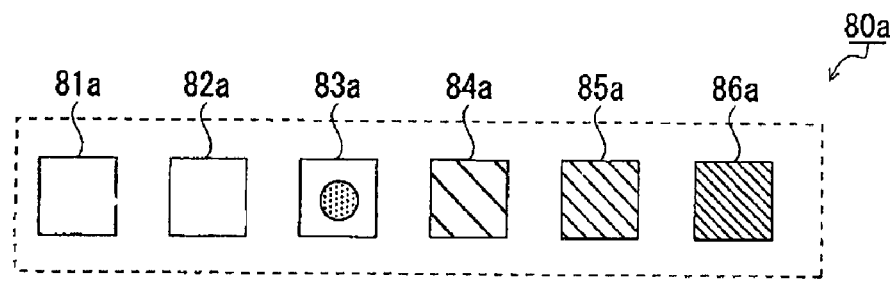
FIG. 18A is a diagram showing the exposure dependency of a residual resist film in an exemplary management pattern.
Figure 18B:
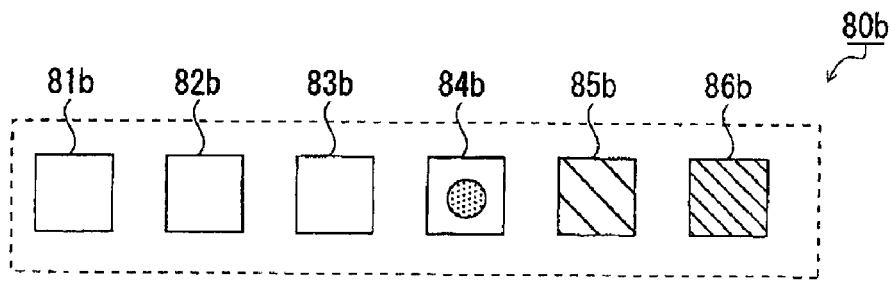
FIG. 18B is a diagram showing the exposure dependency of a residual resist film in an exemplary management pattern.
Figure 18C:
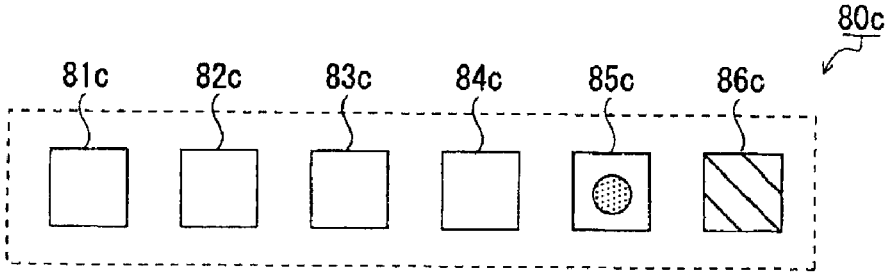
FIG. 18C is a diagram showing the exposure dependency of a residual resist film in an exemplary management pattern.

For example, a residual resist film is measured for the exposure time of 290 ms providing a target exposure amount for the management pattern 70 and the exposure times of 285 and 295 ms deviated by ±5 ms from the 290 ns exposure time. FIGS. 18A to 18C are views showing exposure dependency of a residual resist film in the management pattern.

FIG. 18A shows a residual resist film for 285 ms exposure time, FIG. 18B shows a residual resist film for 290 ms exposure time, and FIG. 18C shows a residual resist film for 295 ms exposure time.

For example, for the 285 ms exposure time, the resist is entirely removed from a BOX pattern 82a having a space width of 330 nm (FIG. 18A), for the 290 ms exposure time, the resist is entirely removed from BOX patterns 82b and 83b having respective space widths of 330 and 320 nm (FIG. 18B), and for the 295 ms exposure time, the resist is entirely removed from BOX patterns 82c, 83c and 84c having respective space widths of 330, 320 and 310 nm (FIG. 18C).

With the management pattern 70 provided in the photomask, the naked eye may be used to check for a resist pattern corresponding to the management pattern after development. It will be apparent that the resist has been removed from the BOX pattern having the space width of 330 nm, and when the resist remains in the BOX pattern having the space width of 300 nm without being removed, exposure for the target 290 ms±5 ms is achieved. In this manner, finishing of the resist pattern is confirmed by checking whether or not a resist remains for the resist patterns of regions corresponding to the BOX patterns.

With the configuration of the above management pattern, it is possible to detect the resist patterns with sensitivity of ±5 ms, i.e., about 1.7%, with respect to the target 290 ms exposure time. In addition, for higher sensitivity, for example, when the space width decreases from 10 nm to 5 nm which is ½ of 10 nm, the sensitivity can be increased by two times.

Although an optical microscope may be used to check for the resist patterns corresponding to the BOX patterns, this check may be performed with the naked eye depending on size of the BOX patterns.

In addition, although the configuration of the photomask having the management pattern 70 has been illustrated in the third embodiment, the photomask may further include a correction pattern, like the photomask of the second embodiment described with reference to FIG. 11.

In addition, although it has been illustrated in the above embodiments that the i-line stepper (wavelength: 365 nm) is used as the exposure device, an exposure device having a KrF laser (wavelength: 248 nm) or an ArF laser (wavelength: 193 nm) may be used as a light source.

Following from the above description and invention summaries, it should be apparent to those of ordinary skill in the art that, while the methods and apparatuses described herein constitute exemplary embodiments of the present invention, the invention is not limited to these precise embodiments and changes may be made to such embodiments without departing from the scope of the invention as defined by the claims. Additionally, it is to be understood that the invention is defined by the claims and it is not intended that any limitation or element describing the exemplary embodiments set forth herein is to be incorporated into the interpretation of any claim element unless such limitation or element is explicitly stated. Likewise, it is to be understood that it is not necessary to meet any or all of the identified advantages or objects of the invention disclosed herein in order to fall within the scope of any claims, as the invention is defined by solely by the claims and since inherent and/or unforeseen advantages of the present invention may exist even though they may not have been explicitly discussed herein.

What is claimed is:

1. A method of forming a resist pattern comprising the steps of:
   preparing a photomask for forming a resist pattern having a nonuniform film thickness on a main surface of a target substrate, the photomask including a plurality of mask cells arranged in the form of a matrix on a surface of a transparent mask substrate, a length of one side of each of the mask cells being smaller than a length corresponding to a resolution limit of an optical system of an exposure device, each mask cell including at least one of a light transmission region and a light shielding region, wherein the intensity of light passing through each mask cell depends on a ratio of an area of the light transmission region to an area of the mask cell;

setting the optical system of the exposure device at a vertical focus position other than an optimal focus position, the optimal focus position being the vertical focus position at which the exposure device is focused on a resist film formed on the main surface of the target substrate, wherein the vertical focus position lies along a line oriented perpendicular to the main surface of the target substrate;

exposing the resist film with light passing through the photomask; and developing the exposed resist film to obtain the resist pattern.

2. The method of claim 1, further comprising the steps of, before the step of setting the optical system, preparing a focus positioning mask having a plurality of band-shaped light shielding films arranged with an interval larger than the length corresponding to the resolution limit of the optical system of the exposure device on the surface of the transparent mask substrate;

exposing and developing a plurality of resist films formed on the main surface of the target substrate at a respective plurality of vertical focus positions, and measuring a width of a band-shaped residual resist after each of the plurality of resist films has been developed; and determining the optimal focus position including finding a depth of focus by evaluating a relationship between the plurality of vertical focus positions and the respective measured widths of the band-shaped residual resists.

3. The method of claim 2, wherein, in the step of determining the optimal focus position, the vertical focus position at which the width of the residual resist reaches one of a maximum and a minimum is determined to be the optimal focus position.

4. The method of claim 2, wherein, in the step of setting the optical system, the optical system is set at a vertical focus position spaced from the optimal focus position by a distance equal to or greater than the depth of focus.

5. The method of claim 4, wherein, in the step of setting the optical system, the optical system is set at a vertical focus position spaced from the optimal focus position by a distance between two and ten times the depth of focus.

6. The method of claim 2, wherein the photomask is divided into a device forming region and a device non-forming region;

wherein a correction region is provided adjacent to the device forming region within the device non-forming region; and wherein each mask cell in the correction region has the same ratio of an area of the light transmission region to an area of the mask cell as a mask cell located adjacent to the correction region in the device forming region.

7. The method of claim 6, wherein a management pattern is included in the device non-forming region of the photomask;

wherein the management pattern includes a plurality of box patterns, each of the box patterns including a plurality of mask cells having an area ratio of an area of the light transmission region to an area of the mask cell;

wherein the area ratio is different for different box patterns; and wherein, the method further comprises the step of, after the step of developing the exposed resist film, determining whether or not resist remains for regions corresponding to the box patterns.

8. The method of claim 1, wherein the photomask is divided into a device forming region and a device non-forming region;

wherein a correction region is provided adjacent to the device forming region within the device non-forming region; and wherein each mask cell in the correction region has the same ratio of an area of the light transmission region to an area of the mask cell as a mask cell located adjacent to the correction region in the device forming region.

9. The method of claim 8, wherein at least one of the plurality of mask cells is square.

10. The method of claim 8, wherein a management pattern is included in the device non-forming region of the photomask;

wherein the management pattern includes a plurality of box patterns, each of the box patterns including a plurality of mask cells having an area ratio of an area of the light transmission region to an area of the mask cell;

wherein the area ratio is different for different box patterns; and wherein, the method further comprises the step of, after the step of developing the exposed resist film, determining whether resist remains for regions corresponding to the box patterns.

11. The method of claim 1, wherein a management pattern is included in the device non-forming region of the photomask;

wherein the management pattern includes a plurality of box patterns, each of the box patterns including a plurality of mask cells having an area ratio of an area of the light transmission region to an area of the mask cell;

wherein the area ratio is different for different box patterns; and wherein, the method further comprises the step of, after the step of developing the exposed resist film, determining whether resist remains for regions corresponding to the box patterns.

12. The method of claim 11, further comprising the steps of, before the exposing step, exposing and developing a plurality of resist films formed on the main surface of the target substrate for a respective plurality of different exposure times using a management mask including a pattern having the same configuration as the management pattern; and obtaining exposure sensitivity from a relationship between the different exposure times and the remaining resist for regions corresponding to the box patterns.

13. The method of claim 11, wherein a correction region is provided in a region adjacent to the device forming region within the device non-forming region; and wherein each mask cell in the correction region has the same ratio of an area of the light transmission region to an area of the mask cell as a mask cell located adjacent to the correction region in the device forming region.

14. The method of claim 13, wherein at least one of the plurality of mask cells is square.

15. The method of claim 11, further comprising the steps of, before the step of setting the optical system, preparing a focus positioning mask having a plurality of band-shaped light shielding films arranged with an interval larger than the length corresponding to the resolution limit of the optical system of the exposure device on the surface of the transparent mask substrate;

exposing and developing a plurality of resist films formed on the main surface of the target substrate at a respective plurality of vertical focus positions, and measuring a width of a hand-shaped residual resist after each of the plurality of resist films has been developed; and determining the optimal focus position including finding a depth of focus by evaluating a relationship between the plurality of vertical focus positions and the respective measured widths of the band-shaped residual resists.

16. A photomask used to form a resist pattern having non-uniform film thickness on a main surface of a target substrate comprising:

a plurality of mask cells arranged in a matrix on a surface of a transparent mask substrate, a length of one side of each of the mask cells being smaller than a length corresponding to the resolution limit of an optical system of an exposure device using the photomask, each mask cell including at least one of a light transmission region and a light shielding region;

wherein the photomask is divided into a device forming region and a device non-forming region;

wherein the photomask includes a correction region in a region adjacent to the device forming region within the device non-forming region;

wherein an intensity of light passing through each mask cell is provided depends on a ratio of an area of the light transmission region to an area of the mask cell; and wherein each mask cell included in the correction region has the same ratio of an area of light transmission region to an area of mask cell as a mask cell which is adjacent to the correction region and is included in the device forming region.

17. The photomask of claim 16, wherein at least one of the plurality of mask cells is square.

18. A photomask used to form a resist pattern having non-uniform film thickness on a main surface of a target substrate comprising:

a plurality of mask cells arranged in a matrix on a surface of a transparent mask substrate, a length of one side of each of the mask cells being smaller than a length corresponding to the resolution limit of an optical system of an exposure device using the photomask, each mask cell having one or both of a light transmission region and a light shielding region;

wherein the photomask is divided into a device forming region and a device non-forming region;

wherein the photomask includes a management pattern in the device non-forming region, the management pattern including a plurality of box patterns, each of the box patterns including a plurality of mask cells having the same ratio of an area of the light transmission region to an area of the mask cell;

wherein an intensity of light passing through each mask cell depends on the area ratio; and wherein the area ratio is different for different box patterns.

19. The photomask of claim 18, wherein a correction region is provided in a region adjacent to the device forming region within the device non-forming region; and wherein each mask cell in the correction region has the same ratio of the area of the light transmission region to an area of the mask cell as a mask cell which is adjacent to the correction region and is included in the device forming region.

20. The photomask of claim 19, wherein at least one of the mask cells is square.

\* \* \* \* \*